(12) United States Patent
Bonora et al.

(10) Patent No.: US 6,634,851 B1
(45) Date of Patent: Oct. 21, 2003

(54) WORKPIECE HANDLING ROBOT

(75) Inventors: Anthony C. Bonora, Woodside, CA (US); Roger G. Hine, San Carlos, CA (US); Michael Krolak, Los Gatos, CA (US); John F. Grilli, Palo Alto, CA (US)

(73) Assignee: Asyst Technologies, Inc., Fremont, CA (US)

( * ) Notice: Subject to any disclaimer, the term of this patent is extended or adjusted under 35 U.S.C. 154(b) by 0 days.

(21) Appl. No.: 09/483,625

(22) Filed: Jan. 14, 2000

Related U.S. Application Data
(60) Provisional application No. 60/116,077, filed on Jan. 15, 1999, and provisional application No. 60/116,446, filed on Jan. 19, 1999.

(51) Int. Cl.⁷ .............................................. B25J 18/04
(52) U.S. Cl. .............................. 414/744.3; 74/490.04; 901/15; 901/21
(58) Field of Search ........................ 414/744.3, 744.5; 901/15, 21; 74/490.04, 490.05

(56) References Cited

U.S. PATENT DOCUMENTS

| | | |
|---|---|---|
| 4,955,250 A | 9/1990 | Fisher |
| 5,069,524 A | 12/1991 | Watanabe et al. |
| 5,178,512 A * | 1/1993 | Skrobak .............. 414/744.3 X |
| 5,314,293 A | 5/1994 | Carlisle et al. |
| 5,421,218 A * | 6/1995 | Akeel et al. ............. 414/735 X |
| 5,513,946 A | 5/1996 | Sawada et al. |
| 5,733,096 A | 3/1998 | Van Doren et al. |
| 5,778,730 A | 7/1998 | Solomon et al. |
| 5,794,487 A | 8/1998 | Solomon et al. |

* cited by examiner

Primary Examiner—Donald W. Underwood
(74) Attorney, Agent, or Firm—O'Melveny & Myers LLP

(57) ABSTRACT

A wafer handling robot is disclosed for transporting workpieces such as semiconductor wafers and flat panel displays between process tools and/or workpiece storage locations within a wafer fab. The robot includes a base comprising a rigid backbone for providing a significant degree of structural stability to the robot. The base further includes a mast, a linear drive system for translating the mast, and a shoulder drive system for rotating the mast. The shoulder drive system includes a harmonic drive reduction system for providing a stiff, smooth and precise output rotation of the mast section. The robot further includes a proximal link fixedly mounted to the mast for rotation with the mast, and a distal link rotatably mounted to the proximal link. An end effector for supporting various workpieces is rotationally mounted to the distal end of the distal link. An elbow drive is mounted to the proximal link, extending down into the mast section, for driving rotation of the distal link with respect to the proximal link. Torque is transmitted from the elbow drive to the distal link by steel straps wrapped around a drive pulley from the elbow drive and a driven pulley in the distal link. Similarly, torque is transmitted from the distal link to the end effector via a second set of steel straps wrapped around pulleys provided in the distal link and end effector, respectively.

25 Claims, 16 Drawing Sheets

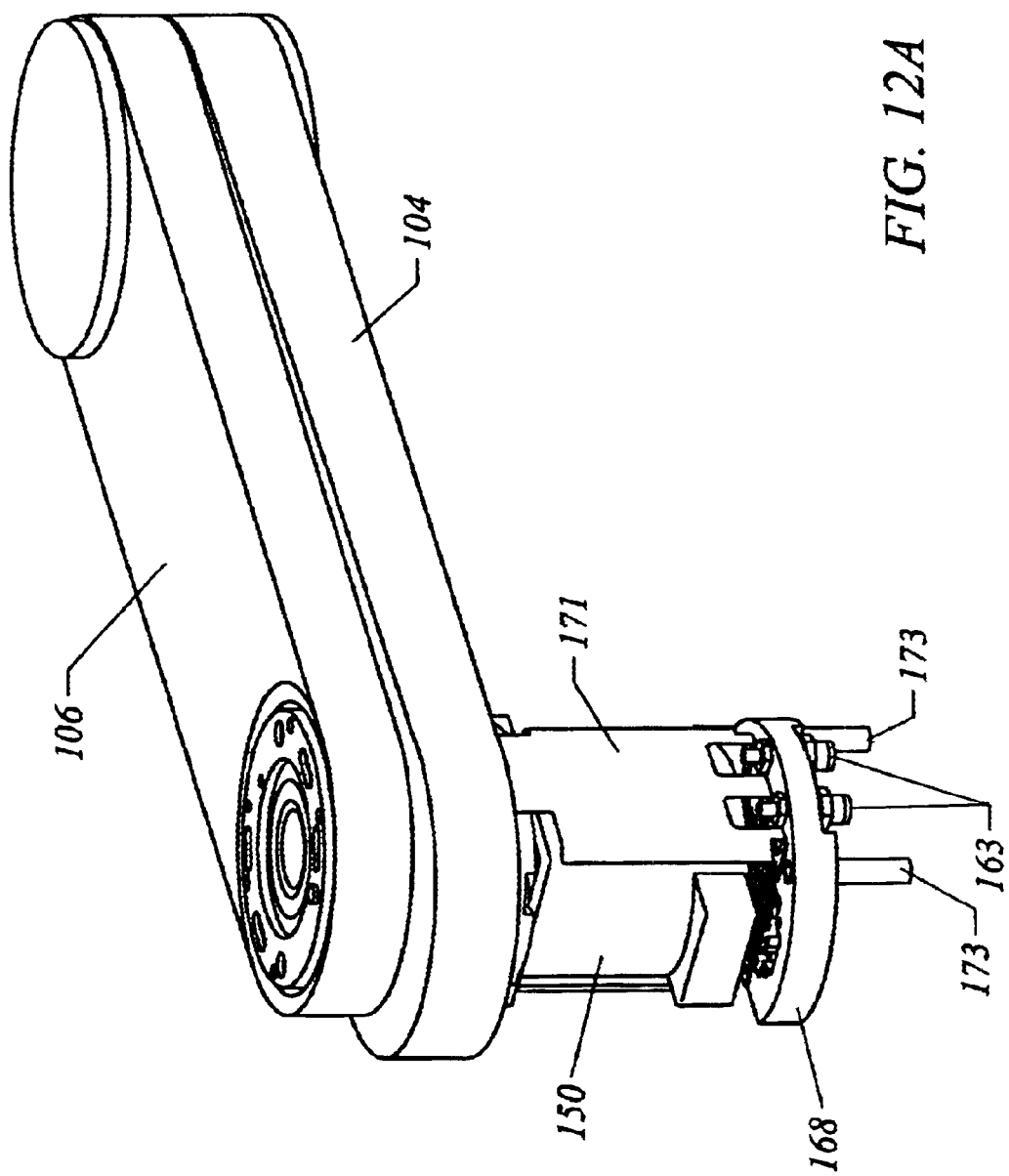

WORKPIECE HANDLING ROBOT

The present application claims priority to U.S. Provisional Patent Application Serial No. 60/116,077 filed Jan. 15, 1999, and to U.S. Provisional Patent Application Serial No. 60/116,446 filed Jan. 19, 1999.

BACKGROUND OF THE INVENTION

1. Field of the Invention

The present invention relates to robots for transferring workpieces such as semiconductor wafers between process tools or a process tool and workpiece storage location, and in particular to a precision workpiece handling robot having a robust, scalable and easily configured design.

2. Description of Related Art

The introduction of workpiece handling robots into the semiconductor fabrication process represented a significant advance in automation over manual and early transfer equipment for moving wafers between various process tools and/or workpiece storage locations. It is an important feature of conventional workpiece handling robots to be able to quickly and precisely access a workpiece from a first position, deliver it to a new location having different X, Y and Z coordinates in Cartesian space, and set it down without risk of damage to the workpiece.

In order to accomplish this, a typical robot includes a central mast mounted in a base for translation along a vertical axis. A proximal arm, or link, is rotatably mounted to an upper end of the mast, and a distal arm, or link, is rotationally mounted to the opposite end of the proximal link. The wafer handling robot further includes an end effector pivotally attached to the distal link for supporting the workpiece. Various motors are further provided, conventionally mounted in the base, for translating the central mast, and for rotating the proximal and distal links such that the end effector may be controllably maneuvered in three-dimensional space. In particular, the central mast conventionally comprises a pair of overlapped concentric shafts. A first motor is provided in the base to vertically translate the shafts, a second motor is provided in the base for rotating the proximal link via the outer shaft, and a third motor is provided in the base for rotating the distal link via the inner shaft.

In transporting workpieces such as semiconductor wafers and flat panel displays, it is important that the robot precisely locate the end effector at a desired position with respect to a workpiece to be accessed and/or a location where the workpiece is to be set down. With current wafer storage and transfer systems, an error of even ⅛" in the expected position of the end effector could result in damage or ruin to a workpiece which may be worth thousands of dollars. Moreover, even a minor positioning error in the central shaft, links or motors may result in a significantly larger positioning error by the time the error is carried through to the end effector.

It is difficult to design a robot capable of meeting these precise tolerances and performance requirements. While such robots are known, they employ sophisticated mechanisms which are expensive to implement and difficult to maintain. A further disadvantage to such robots is that they are generally built to precise specifications, and it is not possible to vary, or scale, the length of the various components or overall size of the robot without sacrificing positional accuracy and performance. This is a significant limitation in that different applications often require differently sized components. For example, 200 mm and 300 mm wafer fabrications require significantly different positioning requirements for a wafer handling robot. It is therefore desirable to be able to scale the length of the base and/or mast for a greater vertical stroke, as well as to be able to scale the links for a greater horizontal reach.

SUMMARY OF THE INVENTION

It is therefore an advantage of the present invention to provide a wafer handling robot capable of precise positional accuracy and repeatability.

It is a further advantage of the present invention to provide a wafer handling robot with a simple design and low number of parts to facilitate easy configuration and maintenance.

It is another advantage of the present invention to provide a wafer handling robot with a large mean time between failure.

It is a still further advantage of the present invention to provide a wafer handling robot with scalable components.

It is a further advantage of the present invention to provide a sealed robot capable of operating in hostile environments and capable of maintaining an environment different than that surrounding the robot.

These and other advantages are provided by the present invention which in general relates to an improved wafer handling robot for transporting workpieces such as semiconductor wafers and flat panel displays between process tools and/or workpiece storage locations within a wafer fab. The robot includes a base comprising a rigid backbone for providing a significant degree of structural stability to the robot. The base further includes a mast, a linear drive system for translating the mast, and a shoulder drive system for rotating the mast. The shoulder drive system includes a harmonic drive reduction system for providing a stiff, smooth and precise output rotation of the mast section. The various components included within both the linear and shoulder drive systems are preassembled into the motors to provide a unitized design. This feature allows the motors to be quickly and easily installed within the base during configuration of the robot.

The robot further includes a proximal link fixedly mounted to the mast for rotation with the mast, and a distal link rotatably mounted to the proximal link. An end effector for supporting various workpieces is rotationally mounted to the distal end of the distal link. An elbow drive is mounted to the proximal link, extending down into the mast section, for driving rotation of the distal link with respect to the proximal link. Torque is transmitted from the elbow drive to the distal link by steel straps wrapped around a drive pulley from the elbow drive and a driven pulley in the distal link. Similarly, torque is transmitted from the distal link to the end effector via a second set of steel straps wrapped around pulleys provided in the distal link and end effector, respectively.

The robot according to the present invention is capable of precisely positioning the end effector of the robot at a desired location, while at the same time having a simple, robust and easily maintained design. Moreover, the various components of the robot are scalable to different sizes to handle 200 mm and 300 mm requirements, as well as other applications.

BRIEF DESCRIPTION OF THE DRAWINGS

The present invention will now be described with reference to the drawings in which:

FIG. 12A is a perspective view of the links and an elbow drive according to the present invention;

DETAILED DESCRIPTION

The present invention will now be described with reference to FIGS. 1–15 which in general relate to a workpiece handling robot for transferring workpieces between process tools or a process tool and workpiece storage location. It is understood that the workpieces to be transported by the present invention may comprise various flat, planar objects including semiconductor wafers, reticles and flat panel displays. Alternatively, the workpieces to be transported may comprise containers for storing and transporting one or more wafers, reticles or flat panel displays. The robot according to the present invention may operate at various locations within a wafer fab, including for example within a minienvironment located at the front end of a process tool, or alternatively as part of a cluster tool for transporting workpieces to and between a plurality of process tools. Moreover, as will be explained in greater detail below, the present invention is adapted to work in various wafer fab environments, including for example hostile environments comprised of corrosive gasses and/or liquids. It is further understood that the robot according to the present invention may comply with and allows compliance with all applicable SEMI standards.

Figure 1:
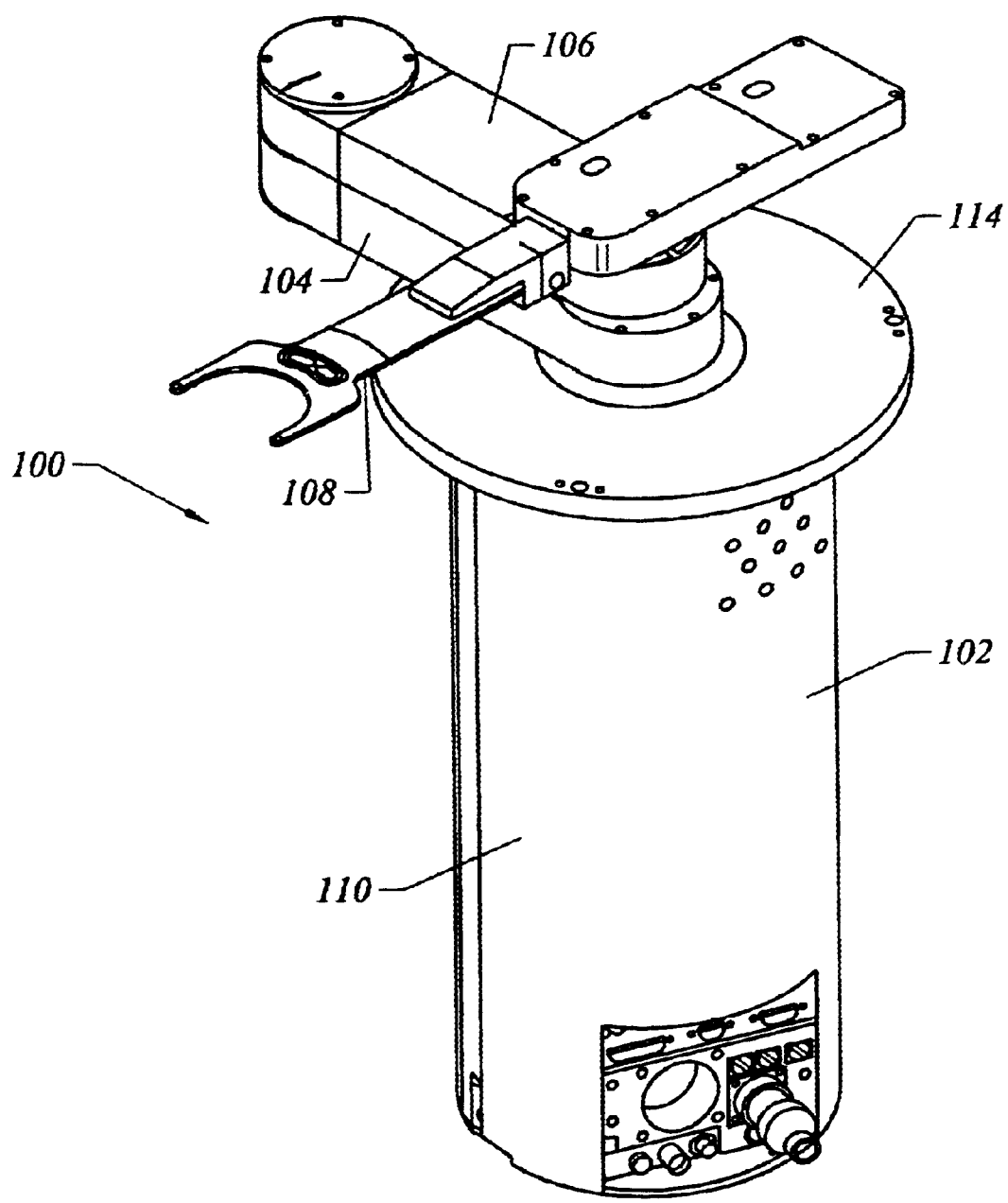
FIG. 1 is a perspective view of a wafer handling robot according to the present invention.
Figure 2:
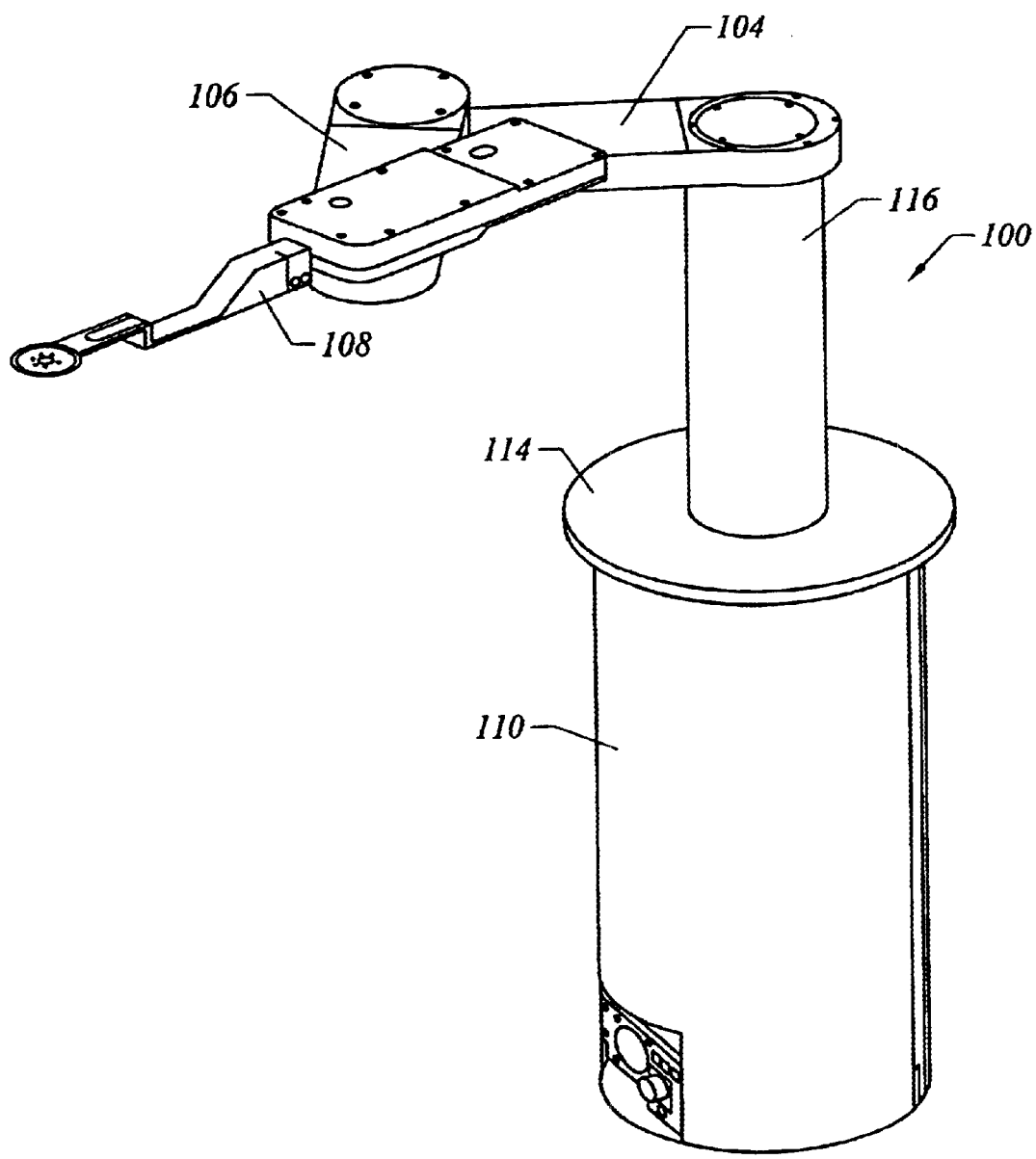
FIG. 2 is a perspective view of the wafer handling robot shown in FIG. 1 with the mast and links substantially extended.

Referring now to FIGS. 1 and 2, there is shown a robot 100 according to the present invention including a base 102, a proximal link 104, a distal link 106 and an end effector 108. A mast 116 within the base 102 (shown in FIG. 2 but not in FIG. 1) is capable of translation along the vertical Z-axis into and out of base 102, and the proximal link, distal link and end effector are all capable of pivoting about their respective rotational axes in X-Y planes perpendicular to the Z-axis. As such, the end effector may be maneuvered through three dimensional space in the proximity of robot 100.

Figure 3:
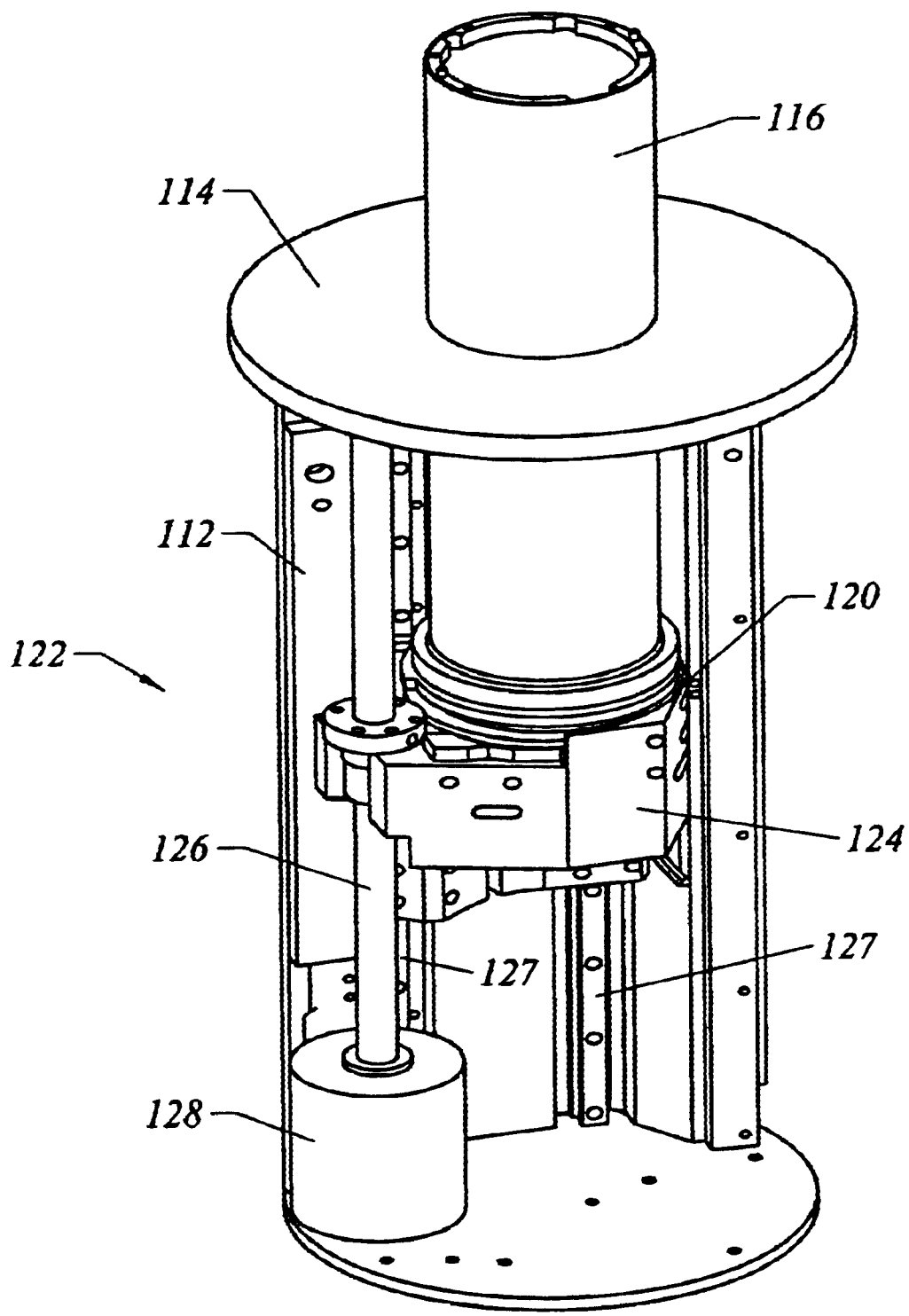
FIG. 3 is a perspective view of a base of the robot with a cover plate of the robot removed.

Referring now to FIGS. 1 through 3, the base 102 includes an arcuate cover plate 110 (removed in FIG. 3) that mates with a backbone 112 to define a cylindrical housing that encloses and protects the components within the base. The height of the base is preferably about 27½", but is scalable to different lengths to cover both 200 mm and 300 mm requirements for standard or extended vertical stroke travel of the mast.

The backbone 112 is preferably formed of extruded aluminum or similarly rigid material to impart a high degree of structural rigidity and stability to the base 102. Conventional wafer handling robots had no component such as backbone 112 to provide the structural rigidity to the base. In prior art designs, several components within the base were used to impart structural rigidity in addition to the exterior housing, such as for example the pair of shafts within the central mast, the lead screw for linear translation, and even the printed circuit board on which the control electronics for the robot were mounted. A problem with such prior art designs is that changing or adjusting one of the base components would affect the load bearing characteristics of the other components as well as the overall structural stability of the base. The situation in the prior art is analogous to tuning a guitar. Varying the tension and tone of one string effects the tension and tone of each of the other strings. In the present invention, the backbone is significantly more rigid than any of the components within the base, and the various other components within the base are not relied upon to provide structural stability. Thus, changing or altering a particular component within the base will have no structural effect on the other components within the base and will have no effect on the overall stability of the base.

Moreover, in certain applications it is desirable to mount the entire robot on a horizontal track to allow the robot to translate horizontally. In conventional robots, there are severe limitations as to where the robot can be mounted to the track such that it will remain stable as the robot moves along the track. Owing to the strength and rigidity of the backbone 112, the robot according to the present invention may be affixed to the track at any location along the backbone without sacrificing the stability or performance of the robot.

As is further shown in FIGS. 1 through 3, the base 102 includes a top plate 114 mating with and affixed to a top portion of backbone 112 and cover plate 110. Top plate 114 includes a central hole 115 through which the mast 116 extends and translates as explained hereinafter.

Figure 4:
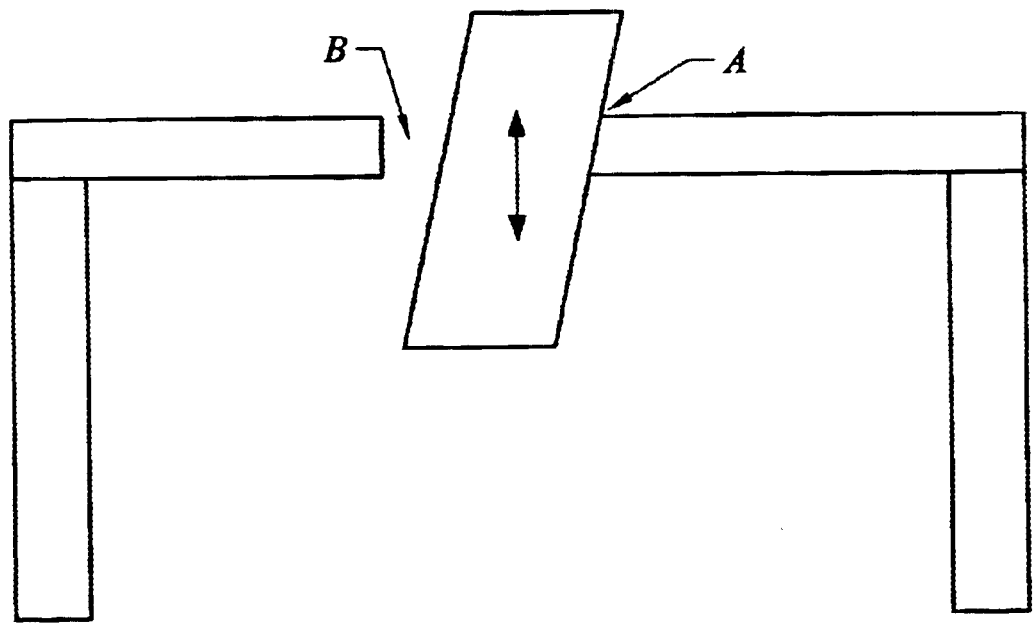
FIG. 4 is a prior art view showing the mast tilted at an angle coming out of the base.

The present invention further includes a floating seal 118 as explained with reference to FIGS. 4, 5 and 8 for sealing the interface between the central hole 115 and the outer diameter of mast 116. As shown in the prior art view of FIG. 4, it is possible that the axis of the central mast 20 be tilted with respect to the vertical axis (the angle of tilt is shown exaggerated in FIGS. 4 and 5 for clarity). In prior art designs, in such an event, as the mast translates for example down into the base 22, one side of the seal shown at A would act as a bearing surface for the central mast while the other side of the seal shown at B could separate from the central mast. In this event, the seal may become worn at location A and particulates and contaminants could enter between the top plate and the central mast at point B.

Figure 5:
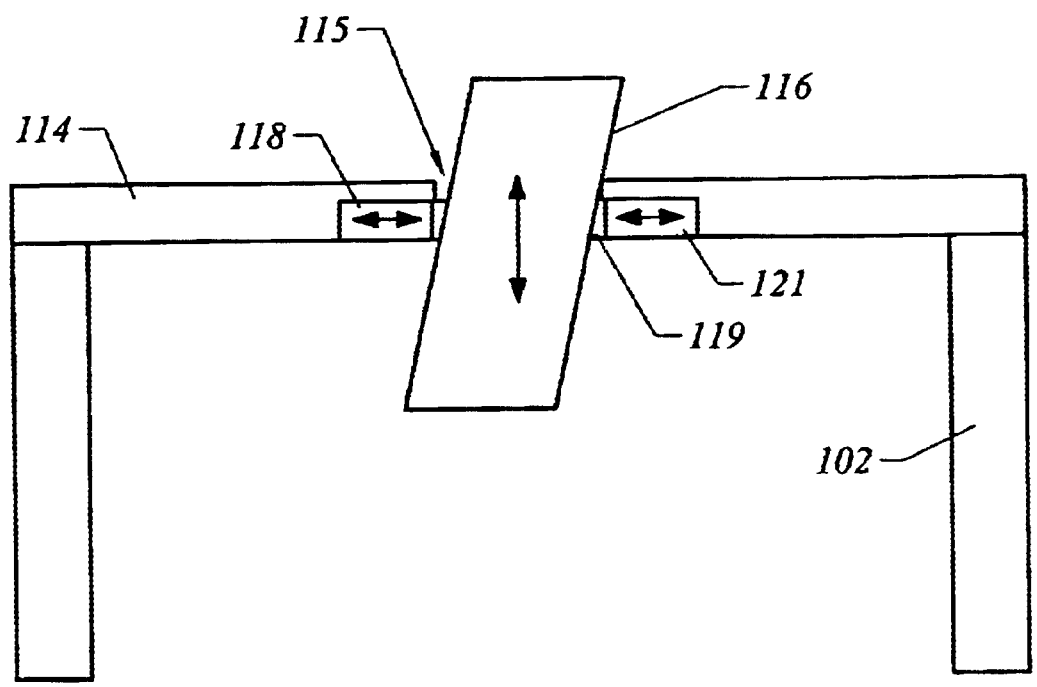
FIG. 5 illustrates a mast coming out of the base tilted at an angle and including a floating seal according to the present invention.
Figure 6B:
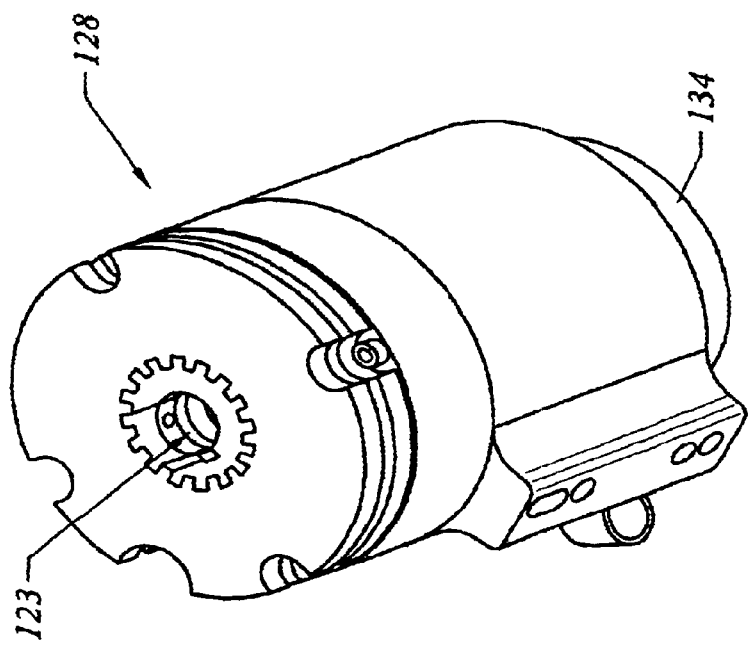
FIG. 6B is a perspective view of a linear drive motor according to the present invention.
Figure 6A:
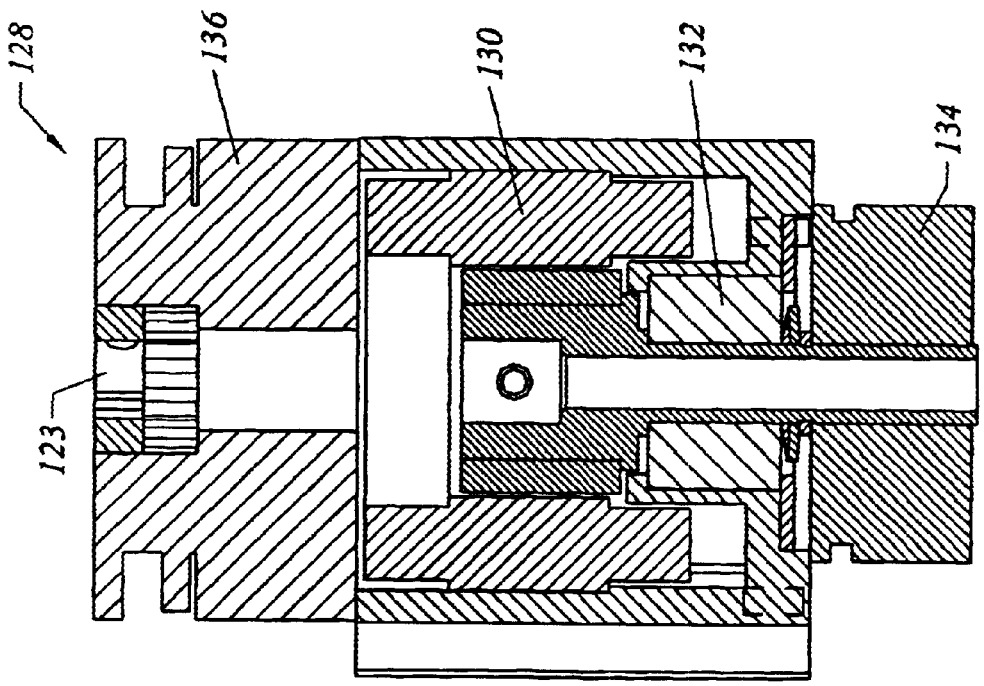
FIG. 6A is a cross-sectional view of a linear drive motor according to the present invention.
Figure 8:
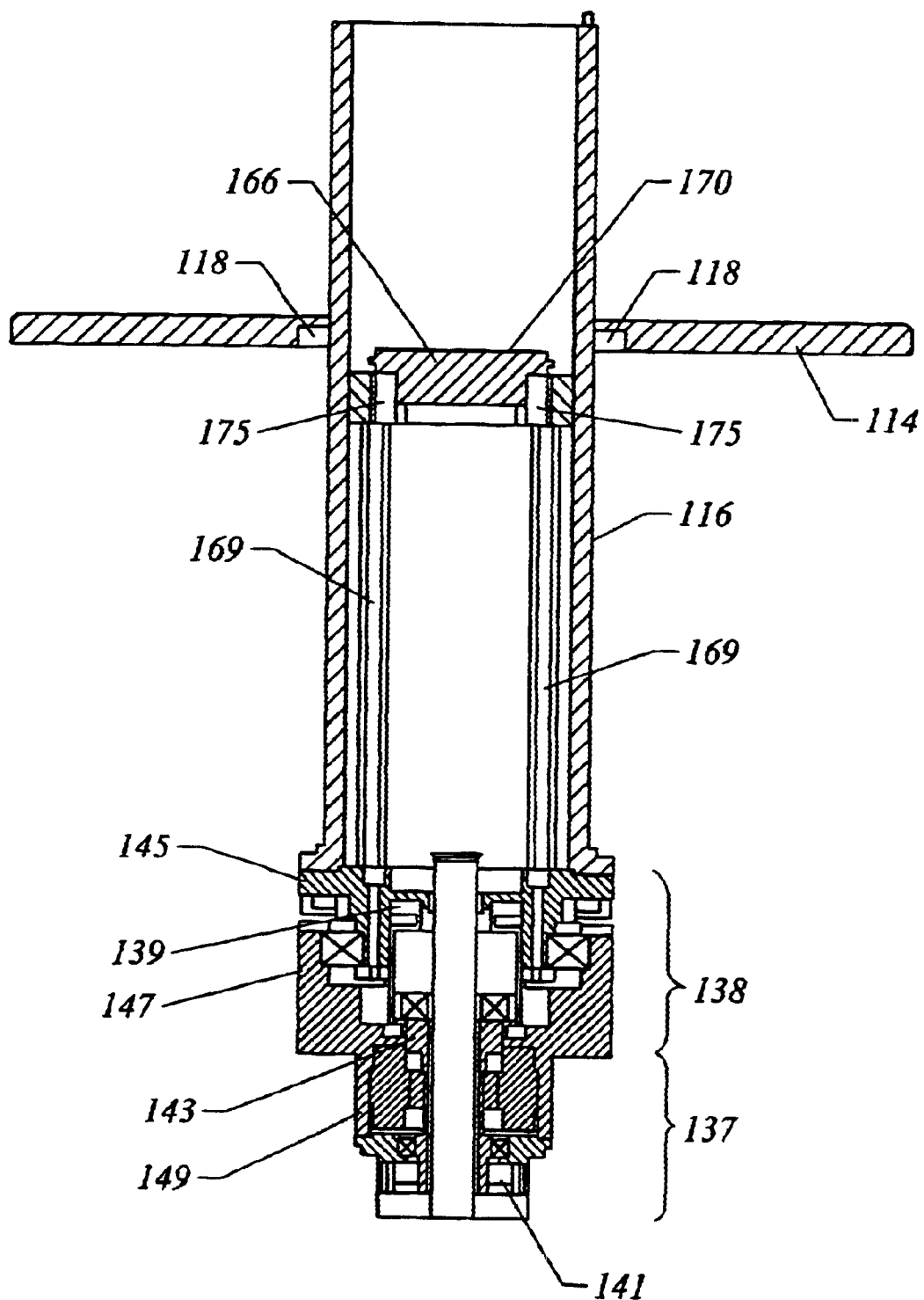
FIG. 8 is a cross-sectional view of a mast and shoulder drive according to the present invention.
Figure 9A:
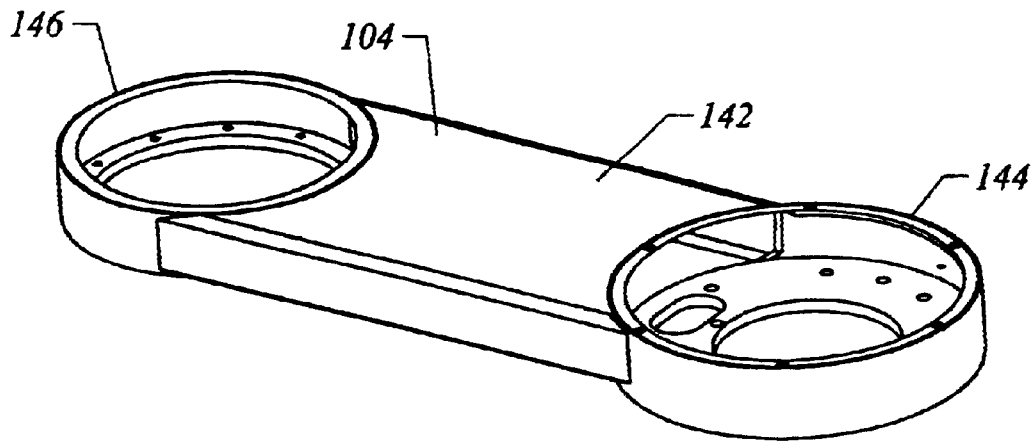
FIG. 9A is a perspective view of a proximal link according to the present invention.
Figure 9B:
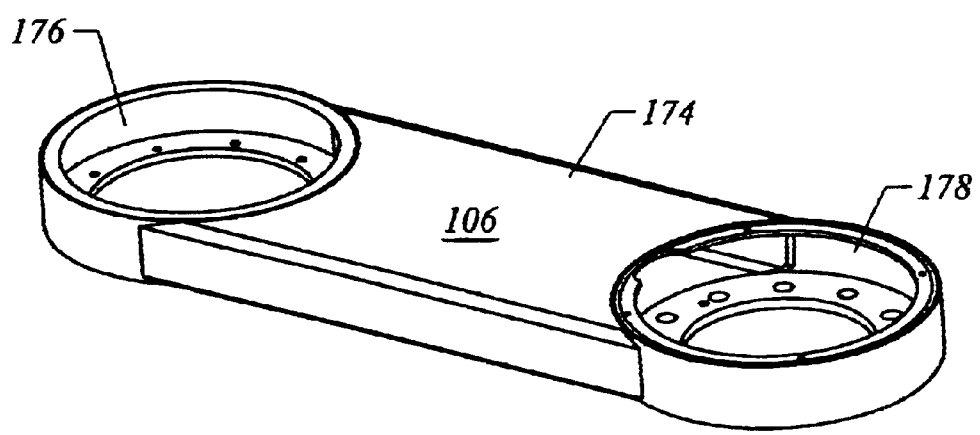
FIG. 9B is a perspective view of a distal link according to the present invention.

The present invention solves this problem by providing a floating seal 118 as shown in FIGS. 5 and 8. As explained below, components are provided to maintain the mast in a vertical orientation and it is unlikely that it would move off of this line. However, in the event the mast 116 becomes slightly tilted with respect to the vertical axes as a result of a shock to the robot for example, the seal 118 will "float", or move radially, as the mast moves upward and downward to prevent the seal from acting as a bearing surface and to prevent a spacing between the top plate and mast. Floating seal 118 may comprise a low friction, low wear ring 119 lying around and in engagement with the mast 116. The ring 119 may be formed of Teflon® or ultra-high molecular weight polyethylene (UHMWPE). Ring 119 is surrounded by a soft, closed cell foam rubber ring 121 of known composition which is affixed to the top plate and which allows the ring 119 to move radially as necessary to accommodate the vertical translation of the mast 116.

The mast is seated on and affixed to a rotating portion of a shoulder drive 120 (explained hereinafter), which drive 120 is in turn supported within a linear drive 122 for translating the drive 120 and the mast 116 linearly along the Z-axis. In particular, linear drive 122 includes a carriage 124 within which the shoulder drive 120 is supported, a ball screw 126 for vertically translating the carriage 124, and a motor assembly 128 for rotating the ball screw 126. Additionally, a pair of rails 127 are affixed to the backbone 112, and the carriage is in turn translationally affixed to the rails 127 via rollers. The structural rigidity of the backbone ensures that the linear drive maintains a purely vertical translation. The carriage 124 is preferably formed of aluminum, and the ball screw 126 is preferably formed of chrome-plated hardened steel. It is understood that other materials having the requisite strength and low particulate generating properties may be substituted for those described above with respect to the carriage and ball screw in alternative embodiments.

In a preferred embodiment, the linear drive motor 128 is preferably comprised of a brushless multiple pole motor. This is preferable to a brushed motor which has a limited life due brush wear. Brushed motors are however contemplated in alternative embodiments. As shown in the partial cross-sectional and perspective views of FIGS. 6A and 6B, the ball screw 126 preferably extends down into a top hole 123 in the motor 128, and is mounted directly to an armature 130 of the motor. The motor preferably includes a single set of angular contact bearings 132 for rotationally supporting the armature 130 within the motor, as well as to support the axial load exerted by the ball screw 126. Having the ball screw 126 coaxial with an output shaft of the motor avoids problems inherent to belt drive systems where the axis of rotation of the ball screw is offset from the axis of rotation of the motor. Such problems include wearing of the belt over time, imprecise torque transmissions upon rapid acceleration and deceleration of the motor, torque losses due to belt slippage, as well as an increase in the number of parts necessary to run the drive system. Motor 128 further includes an integral encoder 134 for closed loop servo control of the motor rotation, and a brake 136 to stop rotation of the ball screw in the event of a power outage where gravity would otherwise cause a rapid drop of the mast. The angular contact bearings 132, encoder 134 and brake 136 are preferably pre-assembled in the motor 128 so that the motor 128 has a unitized design that may be easily attached within the base 102 during configuration of the robot. The linear drive preferably provides a vertical stroke to the mast 116 of approximately 18". However, this distance may be scaled to greater or lesser than that in alternative embodiments.

Referring now to FIGS. 3, 7, 7A, 7B and 8, mast 116 is preferably a hollow cylinder formed of stainless steel tubing of approximately 100 mm outer diameter, 20" long and has a thickness of approximately 0.08". It is understood that the material and dimensions set forth above may vary in alternative embodiments. As previously explained, prior art designs included at least a pair of shafts in a central mast for rotating both the proximal and distal links. The omission of the second concentric shaft used to transmit torque to the distal link allows the mast 116 to be lighter than the pair of shafts in conventional designs and also allows the mast to be made relatively thick, or to include ribs along its length, to be stronger and more sturdy. The enhanced strength allows mast 116 to more precisely transmit the torque from shoulder drive 120 through mast 116 to the proximal link 104. Moreover, removal of the second central shaft from within the mast frees up valuable space within the mast for location of electrical connections and vacuum tubes. The linear drive 122 is capable of reciprocating the mast 116 between the retracted position shown in FIG. 2 and at least the extended positions shown in FIGS. 1 and 3.

Referring now to FIGS. 2, 3 and 8, the shoulder drive 120 is provided for rotating the mast 116 and the proximal link 104, which is fixedly mounted thereto for rotation with the mast 116. In a preferred embodiment, shoulder drive 120 comprises a brushless motor 137 coupled to a harmonic drive reduction system 138. The interior wave generator 139 of the harmonic drive reduction system is coupled to the output shaft 143 of motor 137. As in conventional harmonic drives, the angular velocity of the motor 137 armature is reduced by the system 138 while the torque is increased to thereby generate a very stiff, smooth and precise output rotation. It is contemplated that the harmonic drive reduction system may reduce the angular velocity, and increase the torque output, of the motor by a ratio ranging The mast 116 is coupled to the output spline 145 of the harmonic drive reduction system 138, which in a preferred embodiment is the outermost section of the shoulder drive. Rotation of the shoulder drive 120 thus produces a very stiff, smooth and precise rotation of the mast and proximal link affixed thereto. The shoulder drive is supported by the carriage 124 via an annular adapter plate 147 fixedly mounted to both the carriage 124 and a stationary motor housing 149 encasing the motor 137. Additionally, in a preferred embodiment, the rotating output spline 145 of the harmonic drive reduction system 138 is rotationally supported within the carriage 124 by a large cross roller bearing (not shown) surrounding the output spline 145, and mounted between the output spline 145 and the carriage 124.

In addition to the precision rotation of mast and proximal link, the shoulder drive provides several advantages over conventional wafer handling robot drives. For example, the shoulder drive 120 is mounted so that the motor shaft 143 as well as the output spine 145 from the harmonic drive reduction system 138 are concentric with the mast 116. By comparison, conventional drives use offset motors including belts and associated components to rotate the central mast of the robot. Aligning the shoulder drive coaxially with the mast allows removal of the belt drive, which is a source of rotational error and requires frequent maintenance. Moreover, in addition to the belt, offset drive systems include additional components for their operation, such as for example various pulleys and tensioning idlers. As such, the drive system 120 according to the present invention has less components than conventional systems. Furthermore, use of the coaxial drive system 120 according to the present invention eliminates the high radial bearing loads found in conventional offset drive systems.

The shoulder drive 120 further includes an encoder 141 affixed to the motor shaft 143 at a base of the motor housing 149 to allow closed loop servo control of the mast and proximal link rotation. The motor 137, harmonic drive reduction system 138, cross roller bearings and encoder 141 are preferably all pre-assembled into a unitized construction so that the drive 120 may be easily attached within the base 102 during configuration of the robot.

Referring now to FIGS. 1, 2, 9A and 10–12A, proximal link 104 comprises a rectangular tube 142 with mounting hubs 144 and 146 affixed to opposed ends or formed integrally with tube 142. In a preferred embodiment, the centerline distance from hub 144 to hub 146 may be approximately 9.75". However, as the links are scalable as explained hereinafter, this dimension may vary. Rectangular tube 142 is preferably a one piece construction, seamless hollow tube formed of stainless steel, approximately 3.5" wide and 1.5" inches deep, with a wall thickness of approximately 0.07". The hubs 144 and 146 are preferably permanently mounted to opposed ends of tube 142 as by welding or may be formed integrally with tube 142. In a preferred embodiment, the hubs 144 and 146 may have outer diameters of approximately 3.7" and 3.75", respectively, and both are preferably machined from stainless steel. It is understood that materials and dimensions set forth above for the tube 142 and hubs 144, 146 may vary in alternative embodiments. Various flanges are provided in the hubs 144 and 146 for allowing the link 104 to be mounted to the mast, and for supporting the rotational bearing fixtures within the hubs as explained hereinafter.

The top of mast 116 preferably includes an annular flange 148 (shown for example in FIGS. 7A and 7B) to allow the proximal link 104 to be fixedly attached to the mast 116. In particular, mounting hub 144 includes a first set of holes which align with the plurality of holes 151 in the flange 148 for receiving fasteners such as screws or bolts (not shown) therethrough to fixedly attach the proximal link to the mast. The flange 148 further includes a pair of alignment pins 153 which mate with a second set of holes in the mounting hub 144 to align the proximal link on the mast. Thus, in the event the proximal link is removed from the mast, it may be replaced in the same orientation as when it was removed. This further facilitates easy maintenance of the robot in that the control system can rely on the proximal link (and the attached distal link and end effector) being in the same orientation on the mast as when it was removed. Thus, there is no need to re-teach the relative position between the robot and the tool and/or storage locations the robot services. While a preferred embodiment includes removable fasteners so that the proximal link may be separated from the mast as explained hereinafter, it is understood that the proximal link 104 may alternatively be welded to the mast 116.

As explained in the prior art, conventional links included a tub design with a cover fastened thereto by screws or bolts. Such a design resulted in a slight relative movement between the tub and the cover upon a cantilevered load on the end of the robot. In addition to the relative movement between the cover plate and tub, upon removal of the load, the tightness of the screws resulted in hysteresis in that the cover plate and tub would not return to their relative position before application of the load. This problem is overcome in the present invention as a result of the one piece seamless design of the tube 142. Additionally, the single piece construction allows the weight of the link 104 to be reduced to about 3 pounds without sacrificing structural integrity, thus reducing the moment of inertia of link 104. Further still, the screw holes for fastening the cover to the tub in conventional designs have been removed as a potential source of leakage.

Referring now to FIGS. 10–12A, an elbow drive 150 is mounted within the interior of mounting hub 144 and hangs down into the interior of mast 116. In particular, a motor support plate 152 is mounted to a bottom portion of mounting hub 144 to which the elbow drive 150 is affixed. Elbow drive 150 is structurally and operationally similar to shoulder drive 120, and includes each of the attendant advantages discussed above. In particular, the elbow drive 150 preferably includes a brushless motor 154 coupled to a harmonic drive reduction system 156. The interior wave generator of the harmonic drive reduction system is coupled to the output of motor 154. The velocity and torque reduction range from about 140:1 to about 40:1 in alternative embodiments, and is optimally about 50:1 to thereby generate a very stiff, smooth and precise output rotation. The output spline from the harmonic drive reduction system 156 is affixed to drive boss 161 extending up through a hole in the motor support plate 152. A pulley 162 is in turn affixed over the drive boss 161. Pulley 162 is coupled to the distal link 106 via straps 198, 200 as explained hereinafter so that so that rotation of the pulley 162 by the elbow drive 150 rotates the distal link 106 as desired.

The elbow drive 150 further includes an encoder 160 mounted to the armature of the motor 154 at a bottom portion of the motor 154 to allow closed loop servo control of the mast and proximal link rotation. The motor 154, harmonic drive reduction system 156, encoder 160 and drive boss 161 are preferably pre-assembled into unitized construction so that the drive 150 may be easily attached to the proximal link during configuration of the robot.

In prior art designs, the mechanism for rotating the distal link was located in a bottom portion of the central mast in the base of the robot. Mounting the elbow drive to the proximal link at the top of the mast according to the present invention provides several advantages. First, it is easier to transmit torque from the drive 150 to the distal link. Second, having to transmit torque to the distal link through a central shaft in the mast limited the scalability of the mast section in as much as varying the length of the central shaft could vary the ability of the central shaft to transmit torque. Third, in combination with the electrical and vacuum junctions described hereinafter, mounting of the elbow drive to the proximal link facilitates easy separation of the links and associated components from the base of the robot, thereby making maintenance, repair, and alteration of the robot much easier.

Referring now to FIGS. 7, 8, and 11–12A, the robot according to the present invention further includes a first decoupling plate 166 mounted within an interior of the mast, and a second decoupling plate 168 mounted below elbow drive 150. The first and second decoupling plates 166 and 168 together comprise an electrical and vacuum junction making for easy separation of a top portion of the robot (i.e., the links and end effector) from the robot base. As explained hereinafter, robot 100 includes electrical leads and vacuum tubes threaded from the base, through each section of the robot, and terminating at the end effector 108. Owing to the movement of the various components of the robot, the wires and/or vacuum tubes through the robot occasionally need replacement. In order to accomplish this in prior art robots, the upper portion of the robot and the base of the robot had to be disassembled and the electrical lead(s) or vacuum tube then replaced through the entire length of the robot. Similarly, when it was desired to replace one or both links, the base had to be disassembled so that the electrical and/or vacuum connections could be replaced. Further still, it was not possible to scale the length of the base or links of the robot without replacing the electrical and vacuum connections through the entire length of the robot.

The electrical and vacuum junction according to the present invention allows electrical and vacuum connections in an upper portion of the robot to be separated and reattached to the electrical and vacuum connections in the base of the robot. Thus, the connections in one portion of the robot may be changed or serviced without having to dismantle the other portion of the robot. In particular, electrical and vacuum connections from the base 102 terminate at the first decoupling plate 166. Each of the electrical connections is electrically coupled to a conductive contact pad (not shown) in the upper surface 170 of the first decoupling plate 166. Similarly, the electrical and vacuum connections from the end effector travel through the proximal and distal links and terminate at the second decoupling plate 168 below the elbow drive 150. The electrical connections in the second decoupling plate terminate in conductive contact pads (not shown) in a lower surface 172 of the second decoupling plate 168.

When the robot is assembled, the first and second decoupling plates are positioned adjacent to each other within the mast so that upper surface 170 of the first decoupling plate 166 lies juxtaposed to the lower surface 172 of the second decoupling plate 168 and the contact pads for matching electrical connections align and electrically couple with each other. Additionally, when the first and second decoupling plates are brought adjacent to each other, the vacuum connections on opposite sides of the electrical and vacuum junction are joined. The first and second plates may include vacuum fittings 163 that allow the vacuum connections to be affixed to the respective decoupling plates. An O-ring may be provided on the first and/or second decoupling plate(s) around the opening in the decoupling plate for the vacuum junction to form a seal effectively communicating the vacuum across the junction without leakage.

Figure 7:
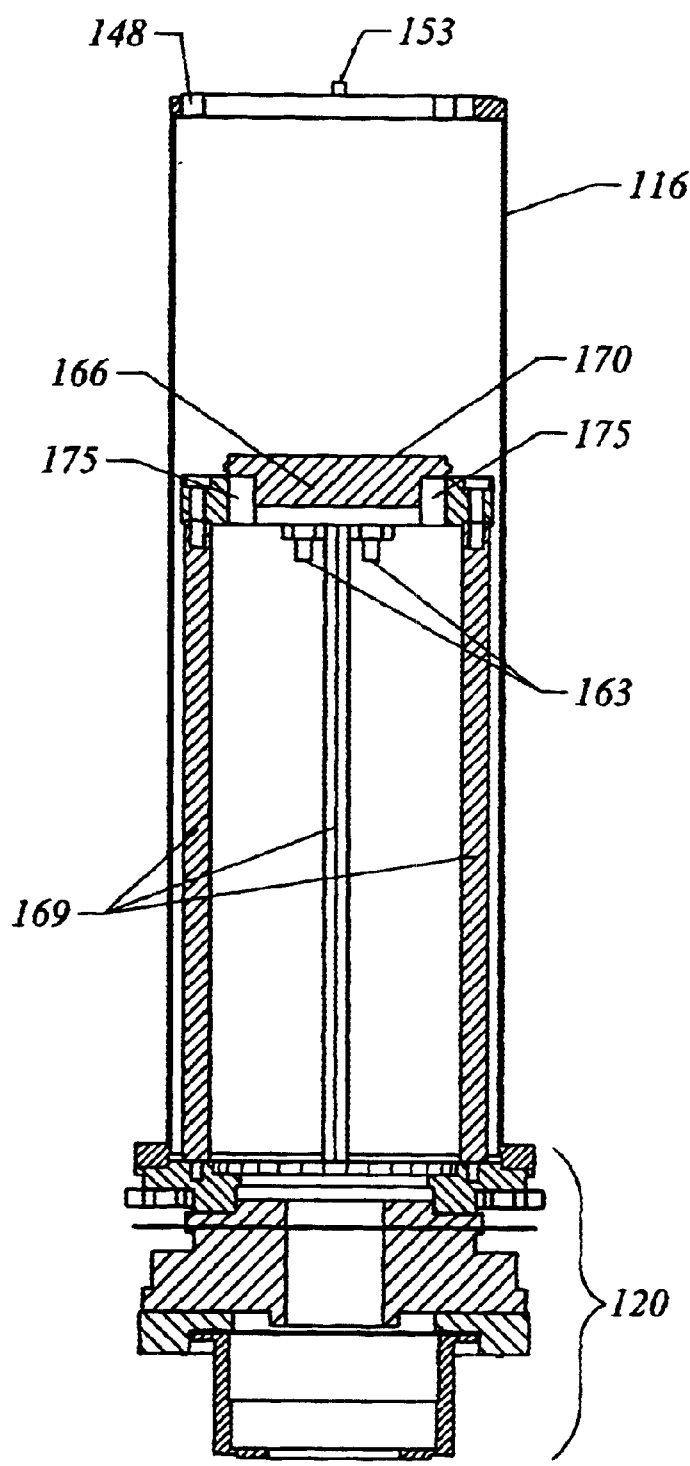
FIG. 7 is a cross-sectional view of a mast and shoulder drive according to the present invention.
Figures 7A, 7B:
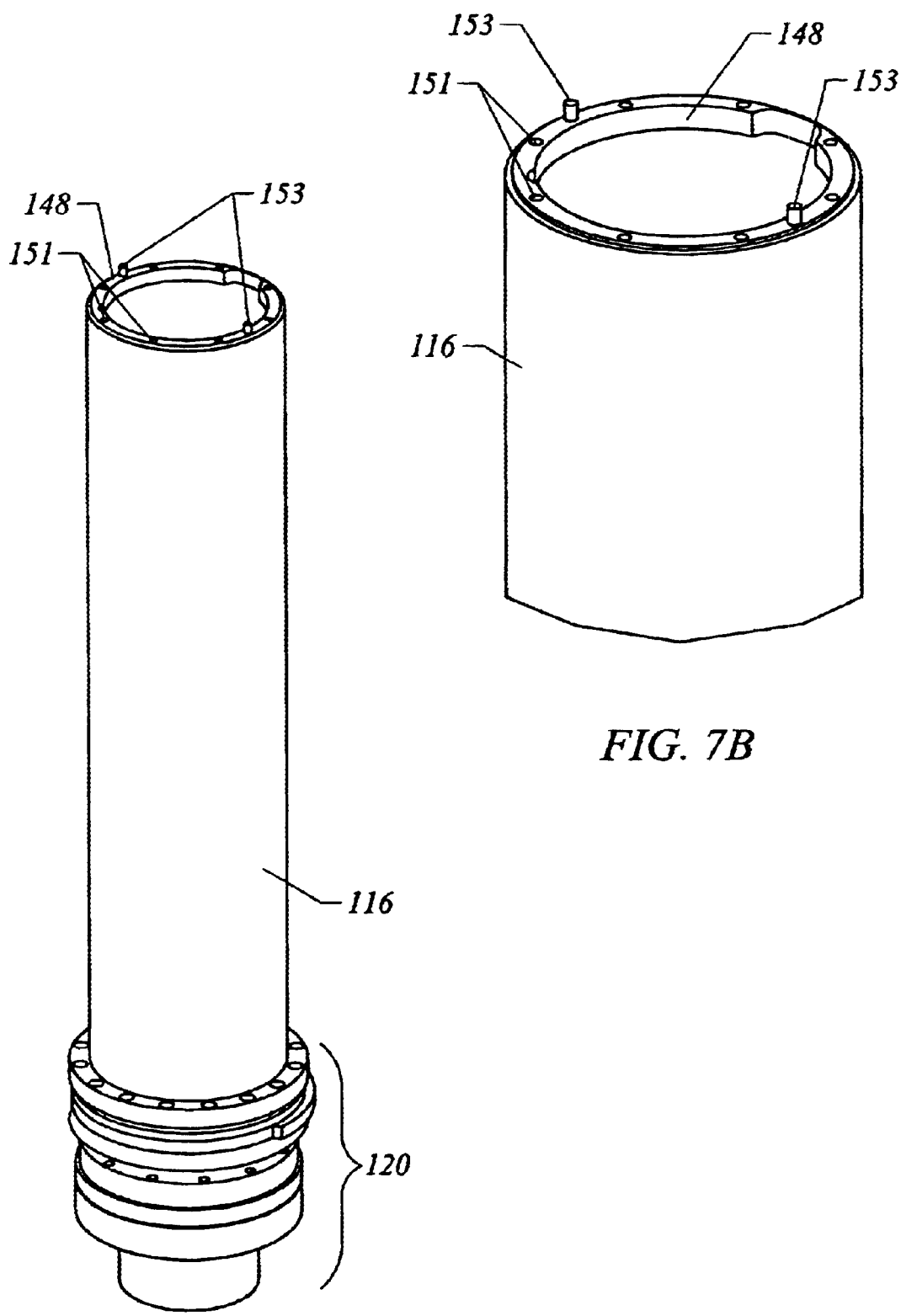
FIG. 7A is a perspective view of a mast and shoulder drive according to the present invention.
FIG. 7B is an enlarged perspective view of a top portion of the mast according to the present invention.

The first decoupling plate 166 is supported within the mast 16 by two or more stand-offs 169 extending up through a portion of the mast 16 (three are shown in FIG. 7). The second decoupling plate is supported by a mounting plate 171 extending down from mounting hub 144 around the elbow drive 150. The stand-offs 169 and mounting plate 171 support the first and second decoupling plates, respectively, at the proper elevations so that when the mounting plate and elbow drive are inserted down into the mast upon mounting the proximal link to the mast, the upper surface 170 of the first decoupling plate 166 lies adjacent to the lower surface 172 of the second decoupling plate 168. The plates 166 and 168 preferably do not touch so as not to interfere with a flush seating of the proximal link on the mast. The second decoupling plate preferably includes a pair of pins 173 which extend down into the holes 175 formed in the first decoupling plate to properly align the plates when they are brought together.

According to this feature of the invention, when it is desired to separate electrical and vacuum connections in the upper portion of the robot from the electrical and vacuum connections in the lower portions of the robot, the fasteners used to join the proximal link with the mast are removed. Thereafter, the proximal link 104 may be lifted away from the mast 116 and the electrical and vacuum connections separated.

In a preferred embodiment, the first and second decoupling plates 166 and 168 preferably include an outer circumference that fits snugly within the mast 116, thus completely isolating the environment below the first decoupling plate from the environment above the second decoupling plate. Thus it is possible to have separate pressures and/or fluid composition above and below the electrical and vacuum junction. O-ring seals may be provided around the outer diameter of the first and/or second decoupling plates to further isolate the space above the junction from the space below the junction.

Referring now to FIGS. 9B–12A, distal link 106 is preferably the same size, shape and weight as, or slightly smaller than, proximal link 104. It is understood that the size, shape and/or weight of distal link 106 may vary from proximal link 104 in alternative embodiments. The link 106 comprises a rectangular tube 174 with mounting hubs 176 and 178 welded to opposed ends or formed integrally on tube 174. Rectangular tube 174 is preferably a one piece construction, seamless hollow tube formed of stainless steel. Various flanges are provided in the hubs 176 and 178 for supporting rotational bearing fixtures as explained hereinafter that allow the distal link 106 to be rotationally mounted to the proximal link 104, and that allow the end effector 108 to be rotationally mounted to the distal link 106.

Figure 10:
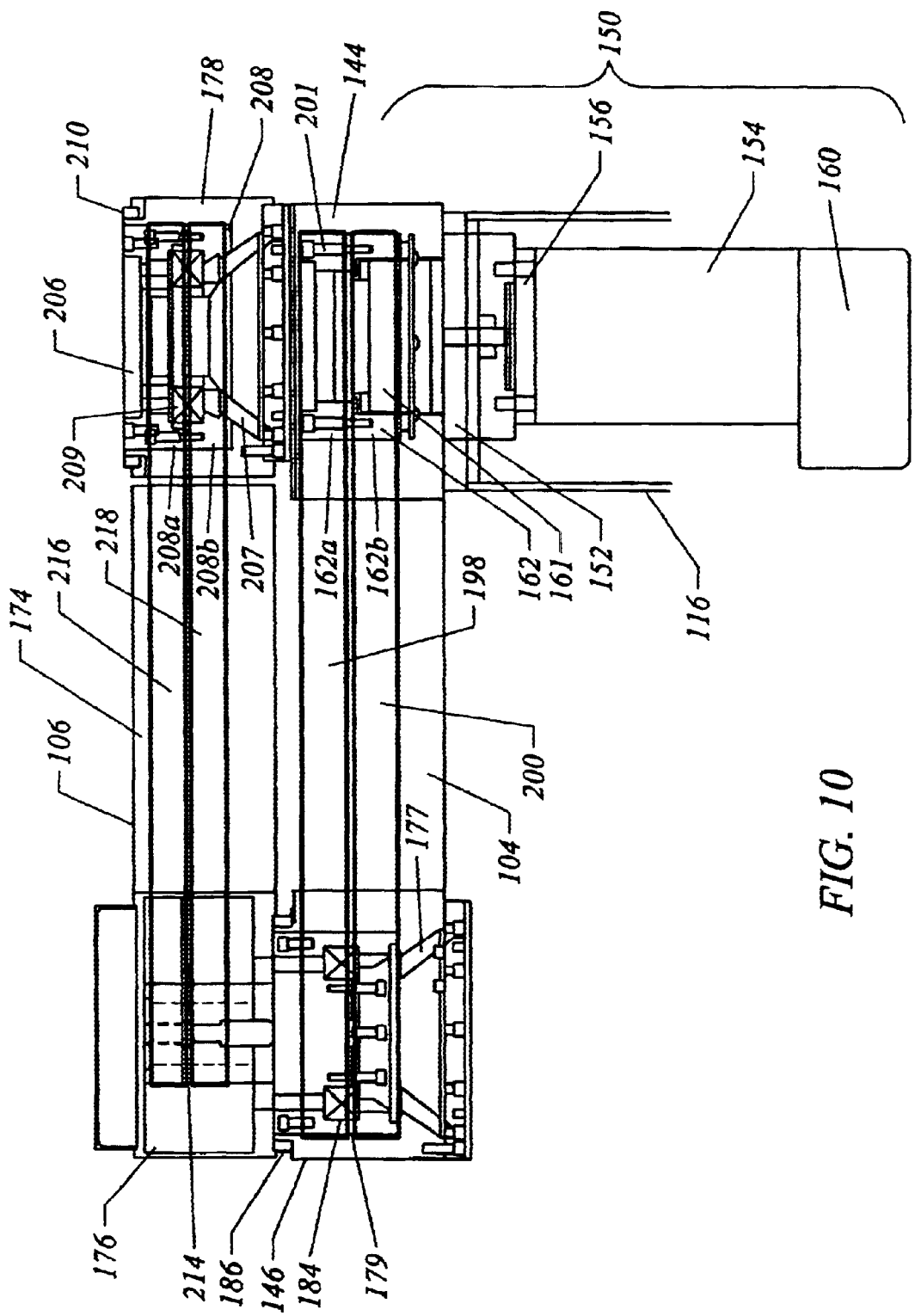
FIG. 10 is a side view of a proximal and distal link according to the present invention.
Figure 11:
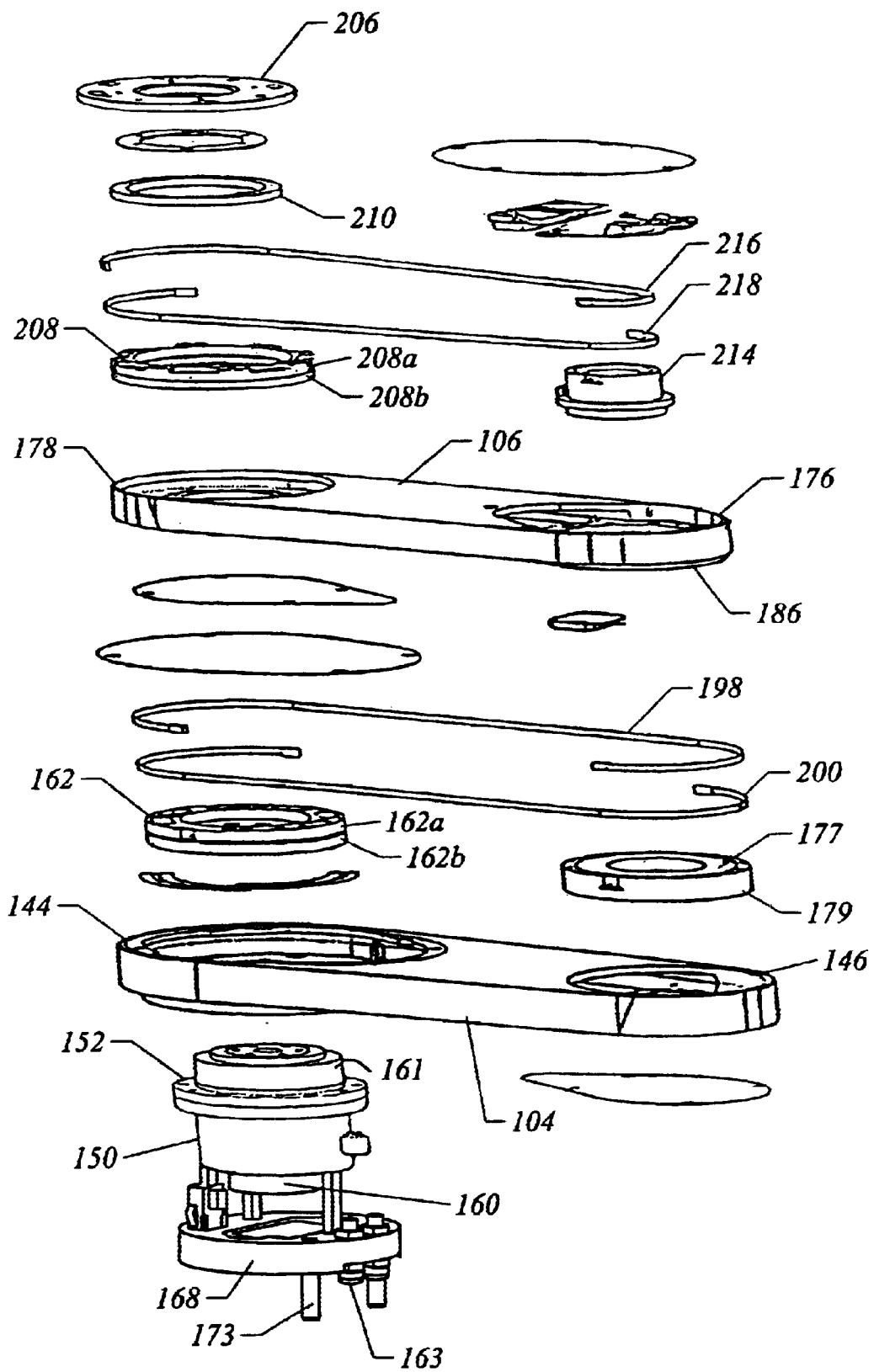
FIG. 11 is an exploded perspective view of the proximal and distal links according to the present invention.
Figure 12:
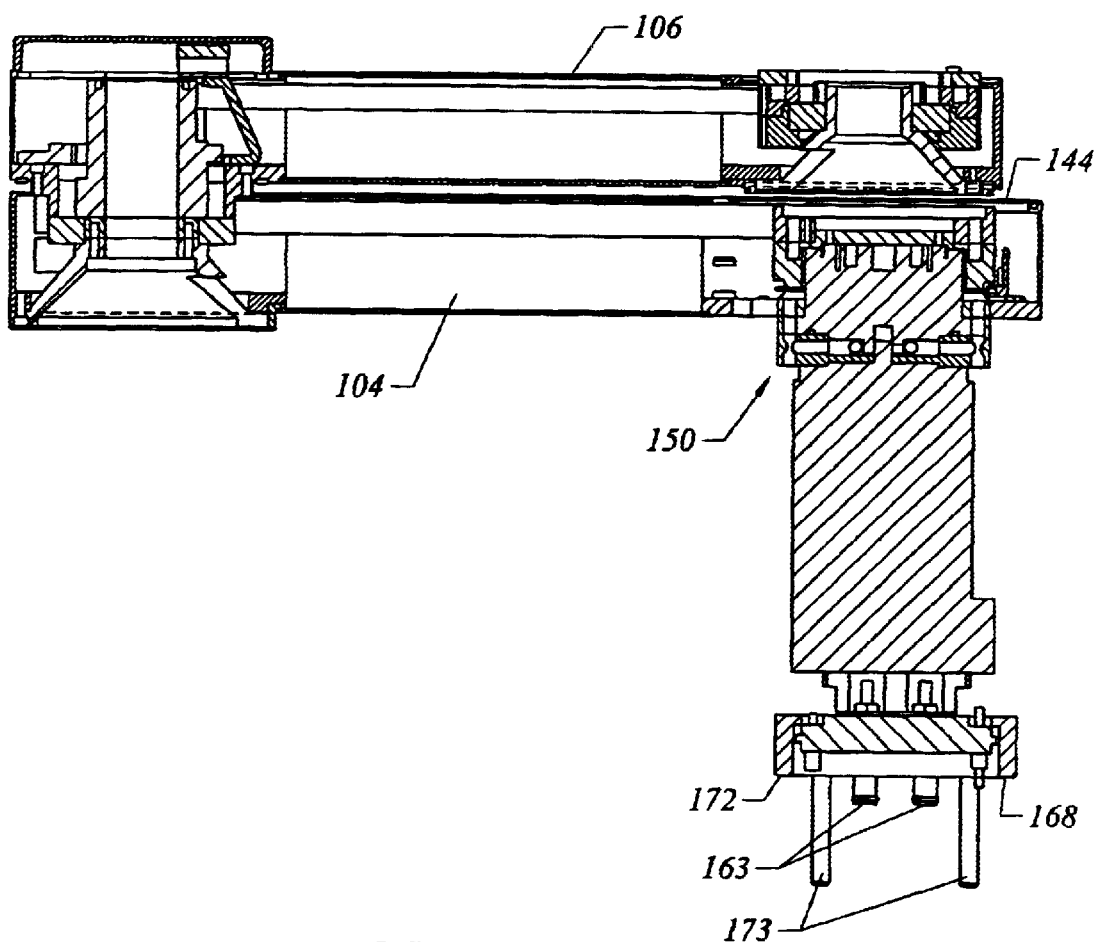
FIG. 12 is a cross-sectional view of the links and an elbow drive according to the present invention.

It is understood that various configurations are contemplated for rotationally mounting the proximal and distal links to each other. Referring to FIGS. 10 and 11, in a preferred embodiment, the mounting hub 146 of the proximal link 104 may include an annular boss 177 fixedly mounted to, and extending up from, a bottom of the mounting hub 146. A lower pulley 179 may be rotationally mounted around the boss 177 by large cross roller bearings 184 mounted between the boss 177 an the lower pulley 179. The lower pulley 179 is fixedly mounted to the distal link 106 so that rotation of the lower pulley 179 by the elbow drive 150 as explained hereinafter causes rotation of the distal link 106. The cross roller bearings 184 provide radial and axial stability and prevent any tilting of the axis of rotation of the distal link with respect to the proximal link. An annular seal 186 is preferably provided between the proximal and distal links to prevent gas or liquid from the external environment from entering in between the proximal and distal links.

Figure 13:
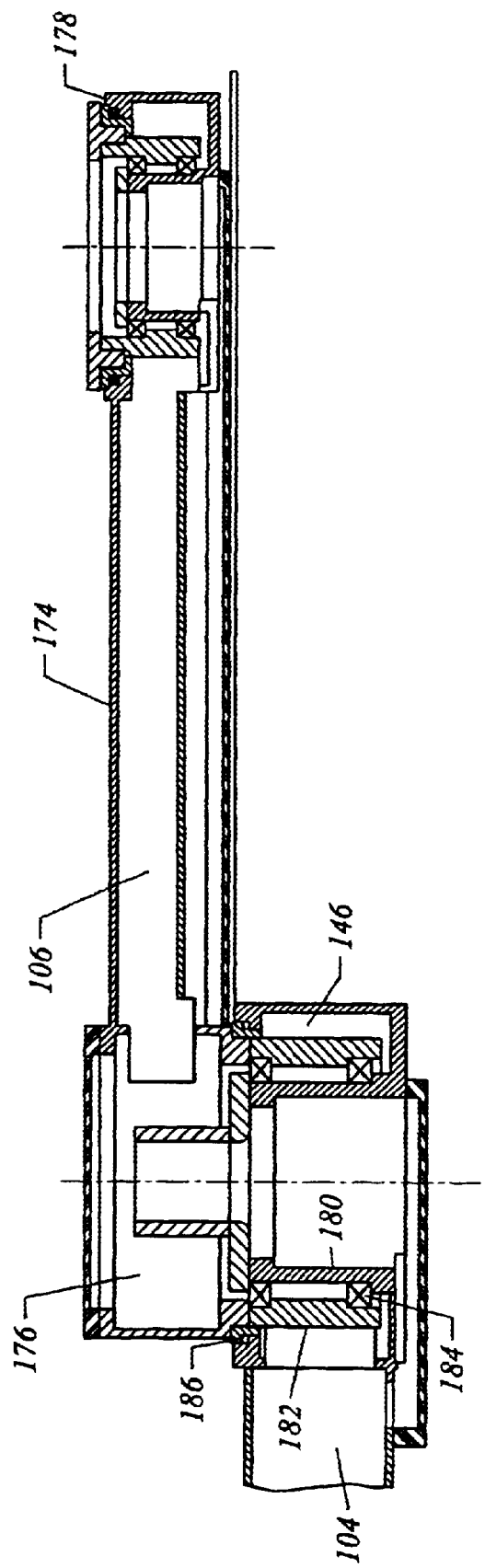
FIG. 13 is a cross-sectional side view of an alternative embodiment for rotational mounting of the proximal and distal links.

It is understood that various other configurations are possible for mounting the distal link on the proximal link. For example, FIG. 13 shows a rotational mounting configuration wherein the mounting hub 146 of the proximal link 104 may include an upwardly extending annular bearing flange 180 machined into the mounting hub. According to this embodiment, mounting hub 176 of the distal link 106 includes a downwardly extending annular lower pulley 182 machined into the mounting hub. The inner diameter of lower pulley 182 is slightly greater than the outer diameter of bearing flange 180 to allow the lower pulley 182 to be rotationally mounted circumjacent about the bearing flange 180 by a single set of cross roller bearings 184. An annular seal 186 is preferably provided between the proximal and distal links to prevent gas or liquid from the external environment from entering in between the links.

Figure 14A:
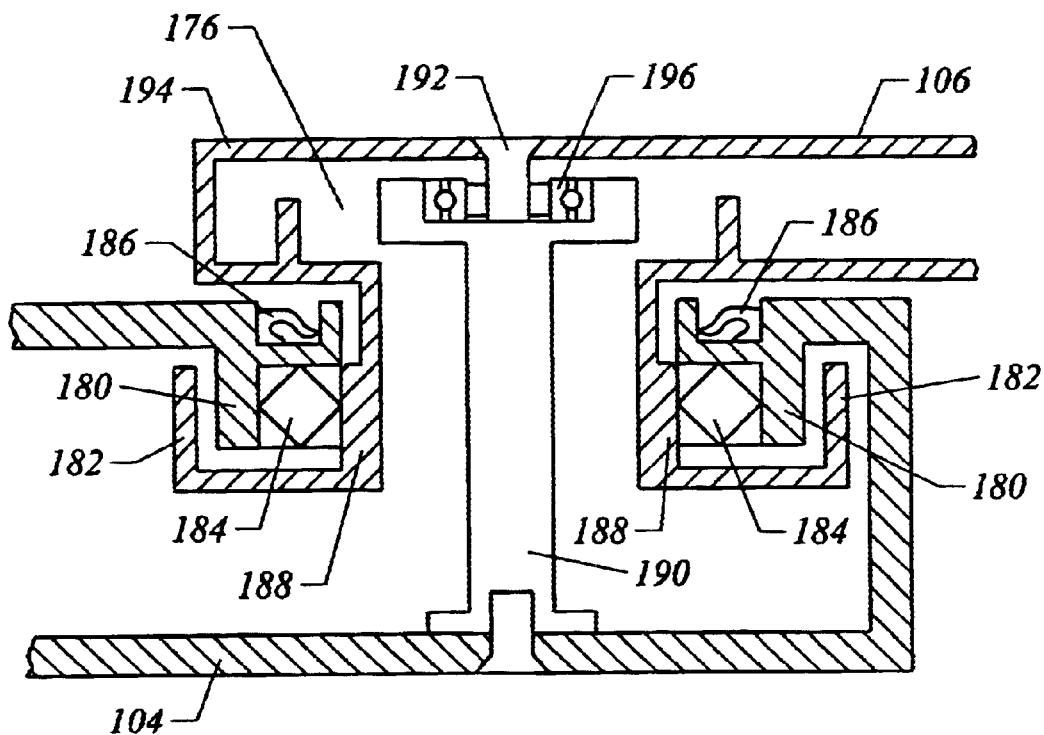
FIGS. 14A and 14B are cross-sectional side views of further alternative embodiments for rotationally mounting the proximal and distal links.

A further alternative rotational mounting configuration between the distal and proximal links is shown in FIG. 14A. FIG. 14A shows a rotational mounting configuration including the downwardly extending annular bearing flange 180 in mounting hub 146 and the upwardly extending annular lower pulley 182 in the mounting hub 176 as described above with respect to FIG. 13. However, according to this embodiment, there is no bearing surface between the flange 180 and pulley 182. Instead, a single set of bearings 184 are positioned on the opposite side of the bearing flange 180 and contact a section 188 machined into the mounting hub 176. According to this embodiment, as opposed to relying on a single set of ball or roller bearings as in the embodiment of FIG. 10 to provide stability, this embodiment further includes a stanchion 190 fixedly mounted within mounting hub 146 of the proximal link 104. Stanchion 190 extends upward and is adapted to receive a spindle 192 fixed through a cover plate 194 mounted within mounting hub 176. A second set of bearings 196 are provided between an upper portion of stanchion 190 and spindle 192 to allow rotation between spindle 192 and stanchion 190, and consequently between the distal link 106 and proximal link 104. In this embodiment, the bearings 184 and 196 together provide both radial and axial stability, and prevent any tilting of the axis of rotation of the distal link with respect to the proximal link. As in the embodiment of FIG. 10, an annular seal 186 is provided to prevent the free flow of contaminants through the interface between the proximal and distal links.

Figure 14B:
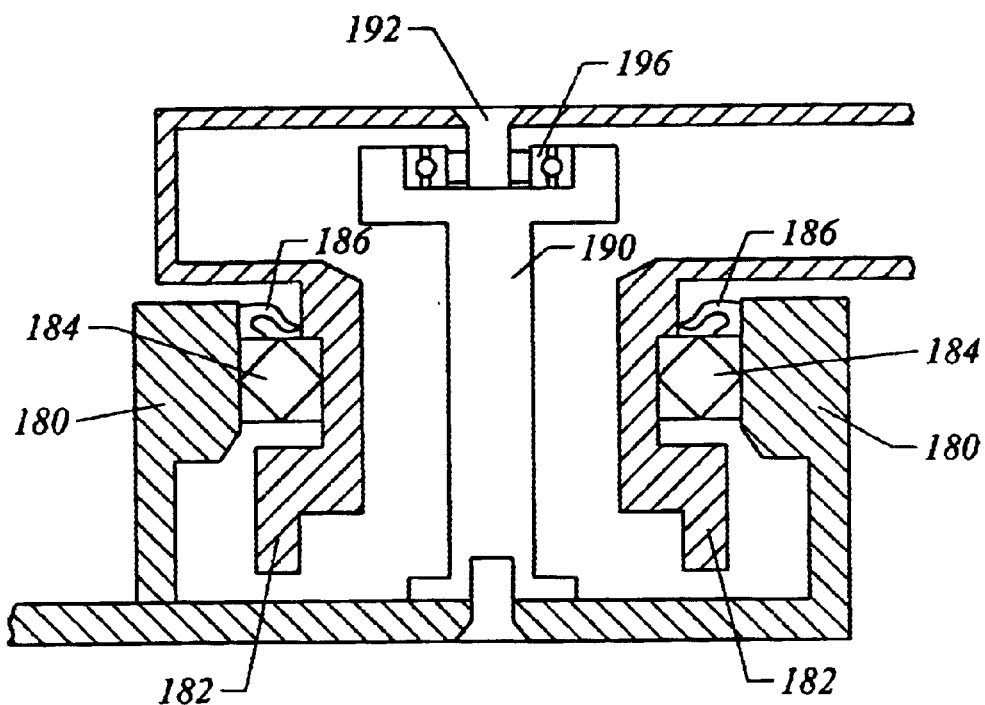

A still further embodiment for rotationally mounting the distal link to the proximal link is shown at FIG. 14B. FIG. 14B is substantially similar to the embodiment shown in FIG. 14A and like reference numerals represent structurally and operationally similar components. In the embodiment of FIG. 14B, the downwardly extending bearing flange 180 is omitted, and instead of the lower pulley 182 extending upward, the lower pulley 182 extends downward.

The rotation of the distal link 106 by the elbow drive 150 will now be described with respect to FIGS. 10 and 11. First and second steel straps 198 and 200 are affixed at one end to pulley 162 of the elbow drive 150, and affixed at their opposite end around lower pulley 179 in the mounting hub 146. The ends of the straps 198, 200 are affixed to the pulley 162 and the lower pulley 179 to prevent slipping of the straps upon rotation of pulley 162 by the elbow drive 150. The respective straps 198 and 200 lie in different, non-overlapping horizontal planes, and are wrapped around the respective pulleys 162, 179 so that the pulleys can rotate approximately 160° in either direction without completely unwrapping the straps from about the pulleys. It is understood that the angle through which the pulleys may rotate in either direction may be greater or lesser than 160° in alternative embodiments, with the provision that the angle be approximately equal to or less than 180°. Moreover, while the straps are metal in a preferred embodiment, they may be formed of other materials in alternative embodiments. Such materials include synthetic polymers such as Kevlar® and Nylon®.

Rotation of pulley 162 in a first direction will pull on one of the straps, for example strap 198, to rotate the lower pulley and consequently the distal link affixed thereto, in a first direction. As this occurs, the strap 200 remains under tension to prevent overshooting the desired link rotation and to minimize settling time (i.e., the time it takes for any oscillation in the link to settle out), if any. Similarly, rotation in the drive pulley in the opposite direction will for example pull on strap 200 to rotate the lower pulley and distal link in the opposite direction. Again, as this occurs, the strap 198 remains under tension to prevent overshooting the desired link rotation and to minimize settling time, if any. Pulley 162 preferably includes upper annular section 162a and lower annular section 162b, which sections 162a and 162b are rotatably coupled to each other. The strap 198 is affixed to the upper section 162a and the strap 200 is affixed to the lower section 162b. The upper and lower sections are provided to be rotational with respect to each other to provide and maintain the desired tensioning between the respective straps 198 and 200. In particular, the sections may be rotated in opposite directions until the desired tension exists between the straps, and then the upper and lower sections are secured to each other to prevent relative rotation therebetween by a set of removable screws 201. The upper section includes arcuate slots and the lower section includes tapped holes. The screws 201 fit through the arcuate slots into the tapped holes, and are tightened down when the proper tension is achieved in straps 198 and 200. In this way, the tension between the straps 198 and 200 may be easily adjusted as necessary to maintain the desired tension.

In addition to avoiding slippage, the use of steel straps 198, 200 provides a torque transmission system that is extremely precise. Additionally, the use of the straps is subject to lower wear than a conventional belt system, and are more easily maintained as explained above. Further still, it may be advantageous to vary the angular velocity of the harmonic drive of the elbow drive 150 to control the torque ripple which may occur in such drives. Straps 198, 200 respond and transmit these rapid accelerations/decelerations much quicker than do conventional timing belts. The straps also perform better than conventional gear systems in that there is no inherent backlash in using the straps. However, it is understood that the respective steel straps may be replaced by a continuous steel band wrapped around the pulleys in an alternative embodiment. In a preferred embodiment, straps 198 and 200 have a width of approximately one inch and, and the straps 198 and 200 are preferably formed of 0.004" thick steel and 0.008" thick steel, respectively. It is understood that the diameter and thickness of the straps 198 and 200 may vary in alternative embodiments.

Figure 15:
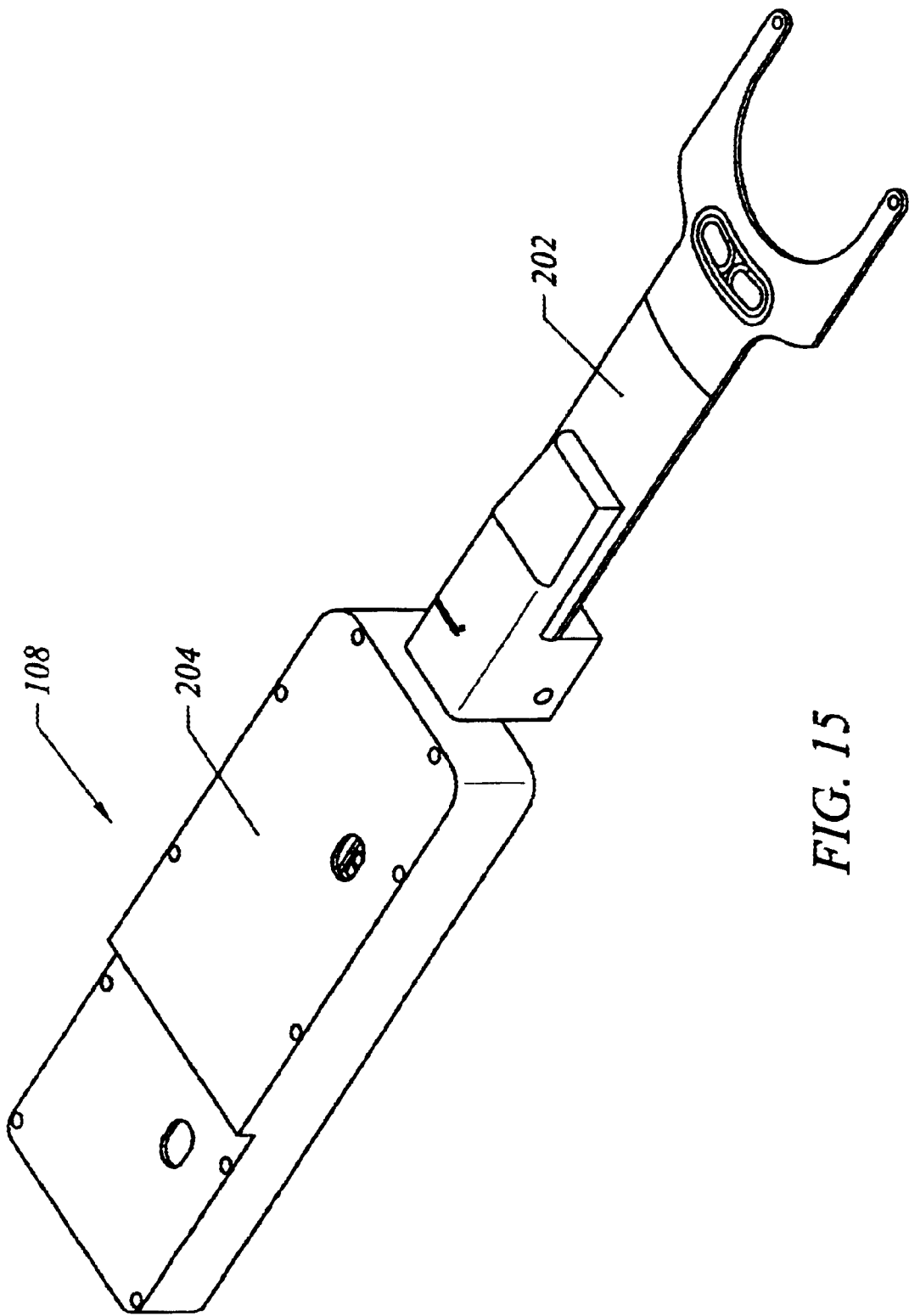
FIG. 15 is a side view of the distal link and end effector according to the present invention.

Referring now to FIG. 15, the present invention further comprises the end effector 108 rotationally mounted to an end of distal link 106 opposite the end mounted to the proximal link. Except as noted below with respect to its rotational mounting to the distal link, the end effector is preferably of conventional design for accessing and supporting wafers for transport. As in conventional designs, the end effector may include a plurality of sensors and translation mechanisms allowing the wafer support section 202 to move relative to a base section 204 of the end effector. In particular, adopting a convention where a Y-axis is horizontal and oriented along the major axis of the end effector, the X-axis is horizontal and perpendicular to the Y-axis, and the Z-axis is vertical and perpendicular to both the X and Y axes, the end effector 108 includes conventional mechanisms allowing the roll angle of the wafer support section 202 to vary (i. e., rotation about the Y-axis), allowing the pitch angle of the support section to vary (i. e., rotation about the X-axis), and allowing the yaw angle to vary (i.e., rotation about the Z-axis). Moreover, it is contemplated that the end effector can be removable so that end effectors of various configurations may be used. Such end effectors include those configured to transport flat, planar workpieces, and those configured to transport workpiece-carrying containers.

As with the rotational mounting of the distal link to the proximal link, it is understood that various configurations are contemplated for rotationally mounting the end effector 108 to the distal link 106. In a preferred embodiment, except as noted below, the end effector is rotationally mounted to the distal link in substantially the same manner that the distal link is rotationally mounted to the proximal link. It is understood that the configuration for mounting the distal link to the proximal link may be different than the configuration for mounting the end effector to the distal link in alternative embodiments.

Referring again to FIGS. 10 and 11, in a preferred embodiment, the end effector 108 may be rotationally mounted to the distal link by affixing the end effector 108 to an end effector mounting plate 206 rotationally mounted within the mounting hub 178 of the distal link 106. In order to rotationally mount the plate 206 within the mounting hub 178, the mounting hub 178 of the distal link 106 may include an annular boss 207 fixedly mounted to, and extending up from, a bottom of the mounting hub 178. A pulley 208 may be rotationally mounted around the boss 207 by large cross roller bearings 209 mounted between the boss 207 an the pulley 208. The end effector mounting plate is fixedly mounted on top of the pulley 208 so as to rotate with the pulley 208. An annular seal 210 is preferably provided between the distal link 106 and the end effector 208 to prevent gas or liquid from the external environment from entering in between these components. It is understood that the end effector may alternatively be rotationally mounted to the distal link in accordance with the embodiments disclosed in FIGS. 13, 14A and 14B.

Transmission of torque from the distal link to the end effector will now be described with reference to FIGS. 10, 11 and 15. An upper pulley 214 is fixedly mounted to the boss 177 in the mounting hub 146, and extends upward therefrom so as to be positioned within the mounting hub 176 of the distal link 106. The upper pulley is constrained to rotate with the boss, which is in turn fixedly mounted to the distal end of the proximal link.

In order to rotate the end effector mounting plate 206 and end effector 208, first and second steel straps 216 and 218 are affixed at one end to upper pulley 214, and affixed at their opposite end around pulley 208. The ends of the straps 216, 218 are affixed to the pulleys 214 and 208 to prevent slipping of the straps upon rotation of upper pulley 214 relative to the distal link 106 (as previously indicated, pulley 214 is fixedly mounted to proximal link 104, and pulley 214 rotates upon rotation of the proximal link 104). The respective straps 216 and 218 lie in different, non-overlapping horizontal planes, and are wrapped around the respective pulleys 214 and 219 so that the pulleys can rotate approximately 160° in either direction without completely unwrapping the straps from thereabout. It is understood that the angle through which the pulleys may rotate may be greater or lesser than 160° in alternative embodiments. Moreover, while the straps are metal in a preferred embodiment, they may be formed of other materials in alternative embodiments. Such materials include synthetic polymers such as Kevlar® and Nylon®. In accordance with the same principles explained above with respect to straps 198 and 200, the straps serve to rotate the end effector 108 upon rotation of the upper pulley 214 (which is in turn driven by the elbow drive 150 as explained above).

Pulley 208 preferably includes upper annular section 208*a* and lower annular section 208*b*, which sections 208*a* and 208*b* are capable of being rotated with respect to each other. The strap 216 is affixed to the upper section 208*a* and the strap 218 is affixed to the lower section 208*b*. The upper and lower sections are provided to be rotational with respect to each other to provide and maintain the desired tensioning between the respective straps 216 and 218 as described above with respect to pulley sections 168*a* and 168*b* of pulley 168. In this way, the tension between the straps 216 and 218 may be easily adjusted as necessary to maintain the desired tension. Electrical connections are provided for supplying power and control signals to the end effector 108 to affect the various articulations of the end effector, as well as for carrying servo signals from the end effector to monitor the articulation of the end effector and various properties of one or more wafers being handled by the end effector. As previously explained, the placement of electrical connections is more easily facilitated by the electrical and vacuum connection junction according to the present invention. In particular, where it is desired to replace wires in the upper portion of the robot 100, there is no need to gain access to the wires in the base of the robot, and conversely, where it is desired to replace wires in the base of the robot, there is no need to gain access to the wires in the upper portion of the robot. As is known in the art, fibre optic wires may also be provided through the robot for performing sensing functions at the end effector.

As indicated, the present invention preferably includes vacuum connections which serve to create suction at a wafer gripping portion of the end effector. The suction is generated from a vacuum source remote from the robot and communicated to the end effector through the robot via vacuum connections. Vacuum connections may preferably be formed of stainless steel with an inner diameter of approximately 0.12", but this material and dimension may vary in alternative embodiments. While one vacuum connection is preferably, it is understood that two or more such tubes may be provided in alternative embodiments. It is further contemplated that one or more tubes may be provided along with the vacuum connections for transporting liquids and/or gasses to or from the end effector. As described above with respect to the electrical connections, replacement of the vacuum connections is greatly facilitated by the provision of the electrical and vacuum connection junction.

The robot 100 according to the present invention is particularly well adapted to working in hostile environments which are preferable for certain applications. In particular, as described above, seals are provided at the interface between all moving parts so that corrosive materials within the hostile external environment are unable to enter the interior of the robot. In addition, once the components within the various hubs are installed, the top of mounting hub 144 of the proximal link is sealed with an annular plate including an annular O-ring seal. The same is true for mounting hub 176 in the distal link. Furthermore, all external surfaces of the robot are preferably impervious to the corrosive materials used in processes requiring hostile environments. In one embodiment, links may be formed from 300 series stainless steel and then electropolished to improve the resistance to corrosion. Of course, the robot may alternatively be used in cleanroom and other harmless environments.

Additionally, the seals at the various interfaces of moving parts within the robot allow a pressure differential between the interior and exterior of the robot. Thus, for example, where the robot is used in a hostile environment, the pressure within the robot may be elevated relative to the surrounding environment to ensure that any gas flow through interface portions of the robot goes from the interior of the robot surrounding environment, and prevents any contaminants from the hostile environment from entering into the robot. Alternatively, for cleanroom and harmless environments, the pressure within the robot may be maintained at a lower level than the surrounding environment to ensure that any gas flow at interfaces between moving parts of the robot flows from the exterior to the interior of the robot, thereby ensuring that any particulates that may be generated cannot escape into the cleanroom environment.

It is a feature of the robot according to the present invention that it is significantly more scalable (i.e., the length of the various components and overall size of the robot may be increased or decreased) relative to semiconductor handling robots of conventional designs. For example, it is difficult in conventional systems to change the height of the base because, as described above, the various components within the base were used as load bearing components, and varying the height of some or all of the base components would affect their load bearing characteristics and potentially the structural stability of the base. This is not a concern in the present invention due the high strength and stability provided by the backbone 112. The backbone is sufficiently rigid so that varying its height will have no significant effect on the rigidity of the base. Moreover, as the backbone, and not the base components, provides the structural rigidity to the base, the components within the base may be scaled without affecting the rigidity and stability of the base.

Similarly, the design of the robot 100 according to the present invention allows the mast 116 to be scaled without affecting the positional precision or performance of the robot. Owing to the omission of the second central shaft found in the prior art, the single mast may include a more rigid design, and thus the length of the mast may be increased without affecting the transmission of torque from the shoulder drive to the proximal link. Additionally, the elbow drive has been moved up into the proximal link. Thus, the mast may be scaled to greater or lesser lengths without affecting torque transmission to the distal link, and without having to modify the elbow drive or the electrical connections thereto. Further still, with the provision of the electrical and vacuum junction, the length of the wires may be changed in the base section upon a scaling of the mast without affecting the electrical or vacuum connections in the upper portions of the robot.

Furthermore, as previously described, each of the links are formed from seamless rectangular tubes which are not precision machined. The precision machining occurs in the mounting hubs welded on to opposed ends of the rectangular tube. Therefore, the length of the rectangular tube for either the proximal and/or distal link may be easily varied without affecting the structure or operation of the links. Moreover, where prior art designs included a tub and cover configuration which was subject to bowing and hysteresis upon application of a cantilevered load, the seamless design of the links according to the present invention may be increased without the bowing or hysteresis effects.

In addition to the scalability feature, the present invention is more easily configured than semiconductor handling robots found in the prior art. As indicated above, the backbone, and not the other components within the base, is relied upon to provide structural rigidity and stability to the base. Thus, when installing, working on or modifying one of the components within the base, there is no need to afterward check each of the other components within the base to ensure that the load bearing characteristics and performance has not changed. Additionally, location of the elbow drive in the proximal link simplifies configuration in that the multiple central shafts found in the prior art may be replaced by a single mast for rotating the proximal link. Further still, as explained above, the electrical and vacuum junction allows the electrical and/or vacuum connections in the top portion of the robot to be changed without having to change the electrical or vacuum connections in the base of the robot, and visa versa. Further still, the motors used in the shoulder and elbow drives are pre-assembled and have a unitized design. Thus, the amount of work necessary to install or replace either or both of the drives is minimal.

The robot according to the present invention is additionally more robust than conventional wafer handling robots. Again, the structural rigidity and stability provided by the backbone 112 reduces the need for maintenance or repair found in conventional robots due to the fact that a plurality of components in were responsible for providing structural rigidity to the base. Additionally, offset motor and pulley systems found in the drive systems of the prior art have been removed, and replaced by drive systems including armatures that are coaxial with the components they rotate. Additionally, the belts used to drive the links in conventional robots have been removed and replaced by steel straps. Belts are subject to frequent wear and often require replacement, and their removal from the robot of the present invention reduces the maintenance required to keep the robot working properly. Furthermore, the number of components in the present invention has been minimized. For example, the number of bearing sets, the belts, tensioning idlers and multiple central shafts found in the prior art have been omitted in the present invention. Having fewer parts reduces the likelihood a part will require maintenance at any given time.

In addition to the above-described attributes, the robot according to the present invention provides a high degree of precision relative to conventional designs. The backbone and mast each provide significant strength, and the harmonic drives used in the shoulder and elbow drives provide more precision rotation than conventional brushless motors by themselves. Moreover, as explained above, removal of the belts has improved the control of the torque transmission from the various drives in the robot.

Although the invention has been described in detail herein, it should be understood that the invention is not limited to the embodiments herein disclosed. Various changes, substitutions and modifications may be made thereto by those skilled in the art without departing from the spirit or scope of the invention as described and defined by the appended claims.

We claim:

1. A workpiece handling robot, comprising:
   a base, including:
     a rigid backbone structure for imparting structural rigidity to said base;
     a cover fastened to said backbone structure to define an enclosure within said base;
     a pair of guide rails fastened to said backbone structure such that said rails are located within the enclosure;
   a rigid mast having a top mating surface and a bottom mating surface, said mast capable of rotating with respect to said base and moving between a first position where a substantial portion of said mast is retracted within said base, and a second position where a substantial portion of said mast extends out of said base;
   a linear drive system located within said base for moving said mast between said first and second position, said linear drive system including a carriage that is translationally affixed to said pair of guide rails and a drive motor that is capable of controlling the motion of said carriage along said pair of guide rails;

a first rotational drive having a rotating portion secured to said bottom mating surface of said mast and a non-rotatinq portion seated within and secured to said carriage, said first rotational drive adapted to rotate said mast with respect to said base;

a proximal link having a first mounting hub fixedly mounted to said top mating surface of said mast and a second mounting hub;

a distal link having a first mounting hub rotatably coupled to said second mounting hub of said proximal link and a second mounting hub; and a second rotational drive secured to said first mounting hub of said proximal link, said second rotational drive capable of rotating said distal link with respect to said proximal link.

2. A workpiece handling robot as recited in claim 1, further comprising an end effector rotatably coupled to said second mounting hub of said distal link.

3. A workpiece handling robot as recited in claim 1, wherein said base is scalable to different heights.

4. A workpiece handling robot as recited in claim 1, wherein said structural rigidity of said backbone allows said base to be scalable to different heights.

5. A workpiece handling robot as recited in claim 1, further comprising a floating seal between a top of said base and said mast to prevent entry of fluids between said top of said base and said mast as said mast translates, said floating seal capable of moving radially in a horizontal plane.

6. A workpiece handling robot, comprising:

a base, including:
   a rigid backbone for imparting structural rigidity to said base, and
   a cover mating with said backbone to define an enclosure within said base, said cover having a top with an opening having an outer diameter;

a rigid mast having a thickness imparting structural rigidity to said mast, said mast capable of rotation, and capable of moving within said opening of said cover between a first position wherein a substantial portion of said mast is retracted within said base, and a second position wherein a substantial portion of said mast extends vertically up out of said base;

a low friction, low wear floating seal for sealing the interface between said mast and said outer diameter of said opening, and preventing entry of fluids between said outer diameter of said opening and said mast as said mast translates between said first position and said second position, said floating seal further capable of moving radially in a horizontal Diane:

a linear drive, located within said base, for moving said mast between said first position and said second position;

a first rotational drive, located at a bottom of said mast, for rotating said mast with respect to said base;

a proximal link fixedly mounted to said mast;

a distal link rotatable coupled to said proximal link; and a second rotational drive, located at a top of said mast, for rotating said distal link with respect to said proximal link.

7. A workpiece handling robot as recited in claim 5, further comprising a seal between said proximal link and said distal link to prevent entry of fluids between said proximal link and said distal link as said distal link moves with respect to said proximal link.

8. A workpiece handling robot as recited in claim 7, wherein said floating seal and said seal allow the robot to operate in hostile environments by preventing entry of corrosive elements into the robot.

9. A workpiece handling robot as recited in claim 7, wherein said floating seal and said seal allow an environment within an interior of the robot to be maintained at a different pressure than an environment exterior to the robot.

10. A workpiece handling robot as recited in claim 1 wherein said mast is scalable to different lengths.

11. A workpiece handling robot as recited in claim 1, wherein said structural rigidity of said mast allows said mast to be scalable to different lengths.

12. A workpiece handling robot as recited in claim 1, securing said second rotational drive to said first mounting hub of said proximal link allows said mast to be scalable to different lengths.

13. A workpiece handling robot as recited in claim 1, wherein said proximal link is scalable.

14. A workpiece handling robot as recited in claim 1, wherein said first mounting hub of said proximal link is fixedly attached to said top mounting surface of said mast by removable screws.

15. A workpiece handling robot as recited in claim 1, wherein said first mounting hub of said proximal link is welded to said top mounting surface of said mast.

16. A workpiece handling robot as recited in claim 1, wherein said distal link is scalable.

17. A workpiece handling robot as recited in claim 1, further comprising
   a first pulley seated within said first mounting hub of said proximal link, said first pulley being affixed to and rotated by said second rotational drive,
   a second pulley seated within said second mounting hub of said proximal link said second pulley affixed to said first mounting hub of said distal link, and
   at least one strap affixed to said first and second pulleys for transmitting a torque from said first pulley to said second pulley.

18. A workpiece handling robot as recited in claim 17, wherein said at least one strap comprises:
   a first metal strap having a first end affixed to a first location along an edge of said first pulley and a second end affixed to a first location along an edge of said second pulley; and
   a second metal strap having a first end affixed to a second location along said edge of said first pulley and a second end affixed to a second location along said edge of said second pulley;
   wherein rotation of said first pulley in a first direction increases a tension in said first metal strap, and rotation of said first pulley in a second, opposite direction increases a tension in said second metal strap.

19. A workpiece handling robot as recited in claim 17, wherein said first pulley comprises a first upper section and a first lower section, said second pulley comprises a second upper section and a second lower section, and said at least one strap comprises:
   a first metal strap having a first end affixed to a first location along an edge of said first upper section, and having a second end affixed to a first location along an edge of said second upper section; and
   a second metal strap having a first end affixed to a second location along said edge of said first lower section, and having a second end affixed to a second location along said edge of said second lower section;

wherein rotation of said first pulley in a first direction increases a tension in said first metal strap, and rotation of said first pulley in a second, opposite direction increases a tension in said second metal strap.

20. A workpiece handling robot as recited in claim 19 wherein said first upper section of said first pulley is capable of adjustable rotation with respect to said first lower section of said first pulley to adjust a tension between said first and second metal straps.

21. A workpiece handling robot as recited in claim 19 wherein said second upper section of said second pulley is capable of adjustable rotation with respect to said second lower section of said second pulley to adjust a tension between said first and second metal straps.

22. A workpiece handling robot as recited in claim 17, wherein said at least one strap is formed of metal.

23. A workpiece handling robot as recited in claim 17, wherein said at least one strap is formed of a synthetic polymer.

24. A workpiece handling robot as recited in claim 1, wherein said rotating portion of said first rotational drive is substantially coaxially aligned with the axis of rotation of said rigid mast.

25. A workpiece handling robot as recited in claim 1, wherein said second rotational drive is substantially coaxially aligned with the axis of rotation of said rigid mast.

* * * * *